United States Patent
Chun et al.

(10) Patent No.: US 10,519,274 B2
(45) Date of Patent: Dec. 31, 2019

(54) NOVOLAC CURING AGENT WITH ALKOXYSILYL GROUP, METHOD FOR PREPARING THE SAME, COMPOSITION CONTAINING THE SAME, THE CURED PRODUCT, AND USE THEREOF

(71) Applicant: KOREA INSTITUTE OF INDUSTRIAL TECHNOLOGY, Cheonan (KR)

(72) Inventors: Hyun-Aee Chun, Seongnam (KR); Yun-Ju Kim, Seoul (KR); Su-Jin Park, Ansan (KR); Sook-Yeon Park, Gunpo (KR); Sang-Yong Tak, Busan (KR); Sung-Hwan Park, Gunpo (KR)

(73) Assignee: KOREA INSTITUTE OF INDUSTRIAL TECHNOLOGY, Cheonan (KR)

( * ) Notice: Subject to any disclaimer, the term of this patent is extended or adjusted under 35 U.S.C. 154(b) by 259 days.

(21) Appl. No.: 15/110,677

(22) PCT Filed: Jan. 9, 2015

(86) PCT No.: PCT/KR2015/000243
§ 371 (c)(1),
(2) Date: Jul. 8, 2016

(87) PCT Pub. No.: WO2015/105379
PCT Pub. Date: Jul. 16, 2015

(65) Prior Publication Data
US 2016/0326299 A1 Nov. 10, 2016

(30) Foreign Application Priority Data
Jan. 9, 2014 (KR) .................. 10-2014-0003070
Jan. 8, 2015 (KR) .................. 10-2015-0002675

(51) Int. Cl.
| | | |
|---|---|---|
| B32B 15/092 | (2006.01) |
| B32B 27/04 | (2006.01) |
| B32B 27/26 | (2006.01) |
| B32B 27/38 | (2006.01) |
| H01L 21/56 | (2006.01) |
| C08L 61/14 | (2006.01) |
| C09D 163/00 | (2006.01) |
| C09J 163/00 | (2006.01) |
| C08G 59/40 | (2006.01) |
| C08J 5/24 | (2006.01) |
| C08K 5/54 | (2006.01) |
| C08K 7/14 | (2006.01) |
| C09D 163/04 | (2006.01) |
| C09J 163/04 | (2006.01) |
| H01L 23/29 | (2006.01) |
| H05K 1/03 | (2006.01) |

(52) U.S. Cl.
CPC .......... *C08G 59/4085* (2013.01); *C08J 5/24* (2013.01); *C08K 5/54* (2013.01); *C08K 7/14* (2013.01); *C09D 163/04* (2013.01); *C09J 163/04* (2013.01); *H01L 23/29* (2013.01); *H05K 1/0353* (2013.01); *C08J 2363/04* (2013.01)

(58) Field of Classification Search
None
See application file for complete search history.

(56) References Cited

U.S. PATENT DOCUMENTS

| | | | | |
|---|---|---|---|---|
| 3,817,924 A | * | 6/1974 | Young | B29C 63/00 252/589 |
| 4,791,171 A | * | 12/1988 | Cunningham | C08F 8/42 525/100 |
| 4,902,732 A | * | 2/1990 | Itoh | C08G 77/42 523/433 |
| 5,177,157 A | | 1/1993 | Akamatsu | |
| 6,441,106 B1 | | 8/2002 | Goda et al. | |
| 6,506,868 B1 | | 1/2003 | Goda et al. | |
| 6,875,807 B2 | | 4/2005 | Durairaj et al. | |
| 7,365,135 B2 | | 4/2008 | Yang et al. | |
| 8,013,052 B2 | | 9/2011 | Nakamura et al. | |
| 2004/0241331 A1 | | 12/2004 | Durairaj et al. | |

(Continued)

FOREIGN PATENT DOCUMENTS

| | | |
|---|---|---|
| CN | 1784462 A | 6/2006 |
| CN | 101300319 A | 11/2008 |

(Continued)

OTHER PUBLICATIONS

Machine translation of JP-2005290312-A (no date).*
Machine translation of JP-2004149497-A (no date).*
International Search Report for International Patent Application No. PCT/KR2015/000243 filed on Jan. 9, 2015.

(Continued)

*Primary Examiner* — Michael J Feely

(57) ABSTRACT

A new novolac curing agent with an alkoxysilyl group exhibiting excellent heat resistance such as a low CTE and an high Tg when a composite is formed, a preparing method of the same, a composition including the same, a cured article, and an use thereof, are provided. The new novolac curing agent having an alkoxysilyl group of Formulae I-1 to I-4, a preparing method of the new novolac curing agent by alkenylation and alkoxysilylation of the novolac curing agent, a preparing method of the new novolac curing agent by alkoxysilylation of a novolac curing agent, a composition including a novolac curing agent having an alkoxysilyl group of Formulae I-1 to I-4, a cured article and a use thereof, are provided. A composite including a novel novolac curing agent having an alkoxysilyl group exhibits a low CTE and a high glass transition temperature.

20 Claims, 1 Drawing Sheet

(56) References Cited

U.S. PATENT DOCUMENTS

| | | |
|---|---|---|
| 2005/0284087 A1 | 12/2005 | Yang et al. |
| 2008/0269406 A1 | 10/2008 | Bachon et al. |
| 2013/0012619 A1 | 1/2013 | Kitagawa et al. |
| 2015/0051316 A1 | 2/2015 | Chun et al. |

FOREIGN PATENT DOCUMENTS

| | | | |
|---|---|---|---|
| CN | 101585905 A | 11/2009 | |
| EP | 0 423 476 A2 | 4/1991 | |
| EP | 1 086 972 A1 | 3/2001 | |
| EP | 1 137 328 A2 | 9/2001 | |
| EP | 2 543 705 A2 | 1/2013 | |
| JP | S59-93729 A | 5/1984 | |
| JP | H05-170872 A | 7/1993 | |
| JP | 2000-281756 A | 10/2000 | |
| JP | 2001-261776 A | 9/2001 | |
| JP | 2001-294639 A | 10/2001 | |
| JP | 2004-149497 A | 5/2004 | |
| JP | 2005-097405 A | 4/2005 | |
| JP | 2005290312 A | * 10/2005 | ............... C07F 7/18 |
| JP | 2007-502356 A | 2/2007 | |
| KR | 10-2001-0071125 A | 7/2001 | |
| KR | 10-2007-0114164 A | 11/2007 | |
| KR | 10-2013-0112007 A | 10/2013 | |

OTHER PUBLICATIONS

Office Action from Chinese Patent Office for Application No. 201580012579.6 dated Jun. 27, 2017.
Extended European Search Report for Application No. 15735456.4 dated Jul. 5, 2017.

* cited by examiner

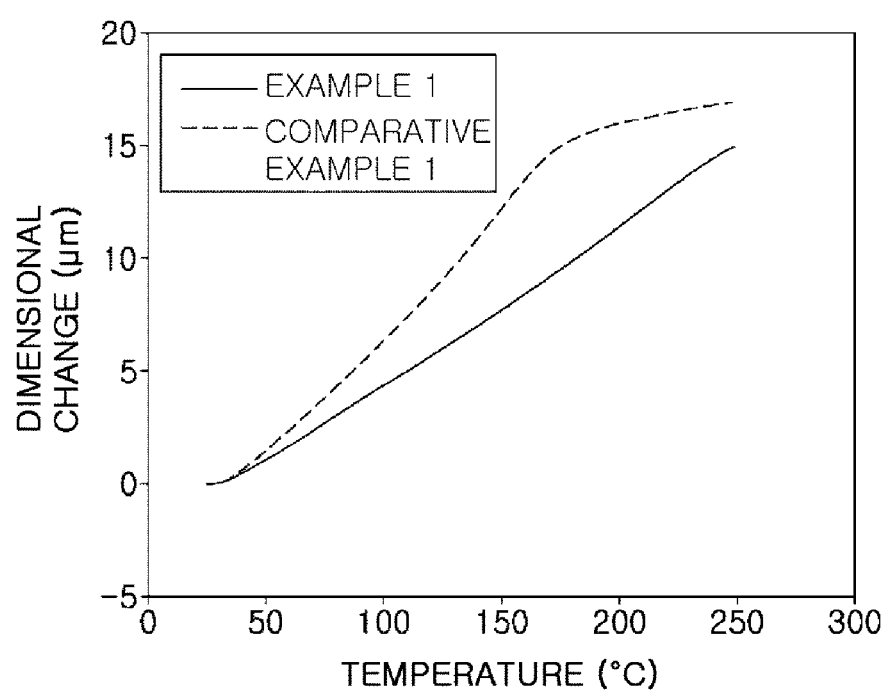

NOVOLAC CURING AGENT WITH ALKOXYSILYL GROUP, METHOD FOR PREPARING THE SAME, COMPOSITION CONTAINING THE SAME, THE CURED PRODUCT, AND USE THEREOF

CROSS-REFERENCE TO RELATED APPLICATIONS

The present specification is a U.S. National Stage of International Patent Application No. PCT/KR2015/000243 filed Jan. 9, 2015, which claims priority to and the benefit of Korean Patent Application Nos. 10-2014-0003070 and 10-2015-0002675 filed in the Korean Intellectual Property Office on Jan. 9, 2014 and Jan. 8, 2015, respectively, the entire contents of which are incorporated herein by reference.

TECHNICAL FIELD

The present disclosure relates to a novel novolac curing agent with an alkoxysilyl group (hereinafter, referred to as 'novel novolac curing agent' or 'novolac curing agent according to an exemplary embodiment in the present disclosure') exhibiting excellent thermal resistance when used in a composite thereof, a preparing method of the same, a composition including the same, a cured article thereof, and a use thereof. More particularly, the present disclosure relates to a novel novolac curing agent with an alkoxysilyl group, exhibiting excellent thermal resistance, in particular, low thermal expansion property, increased glass transition temperature (including Tg-less which does not show glass transition temperature), and excellent flame retardancy in a composite, a preparing method of the same, a composition including the same, a cured article thereof, and a use thereof.

BACKGROUND ART

A Coefficient of Thermal Expansion (CTE) of an epoxy resin is about 50 ppm/° C. to 80 ppm/° C., a significantly higher several to tens of times than that of a ceramic and a metal (for example, a CTE of silicon is 3 ppm/° C. to 5 ppm/° C., and a CTE of copper is 17 ppm/° C.). Thus, for example, in a case in which an epoxy resin is used in conjunction with an inorganic material or a metallic material in the field of semiconductors, displays, and the like, designing and processing of a component may have significant limitations due to CTE-mismatch. In addition, in the case of semiconductor packaging, for example, a silicon wafer and an epoxy substrate may be adjacent to each other, or in a case of a coating in which a polymer film is coated with an inorganic barrier to impart gas barrier properties, the defects such as the crack formation in an inorganic layer, warpage of a substrate, peeling of a coating layer, breakage of a substrate, and the like may occur due to a CTE-mismatch between materials.

Because of a high CTE of an epoxy resin and a subsequently the high dimensional change, the development of technologies such as next generation semiconductor substrates, printed circuit boards (PCB), packaging, organic thin film transistors (OTFT), flexible display substrates, and the like may be limited. Particularly, recently, in the semiconductor and PCB industry, due to an epoxy with a significantly high CTE in comparison with metallic/ceramic materials, the design of next generation components requiring high levels of integration, miniaturization, flexibility, performance, and the like is somewhat challenging.

So far, to improve thermal expansion properties of an epoxy resin (in other words, to achieve a low CTE), generally, (1) a method of making a composite of an epoxy resin with inorganic particles (inorganic filler) and/or a glass fiber, or (2) a method of designing a novel epoxy resin with a decreased CTE have been used.

In a case in which an epoxy resin makes composite with inorganic particles as a filler to improve thermal expansion properties, a large amount of silica inorganic particles having a size of about 2 μm to 30 μm is required to obtain a reduction in a CTE. However, a problem of the decreased processability accompanies due to the inclusion of a large amount of inorganic particles. In other words, a problem such as a decrease in fluidity, a formation of a void when a narrow gap is filled, and the like, may occur due to a large amount of inorganic particles. In addition, even in the case that a CTE of an epoxy composite including a glass fiber is significantly reduced, the CTE thereof may be still be relatively high in comparison with that of a silicon chip, or the like.

As described above, due to limitations of the current epoxy composite technology, manufacturing of highly integrated and high performance electronic components such as next generation semiconductor substrates, PCBs, and the like may be limited. Thus, to overcome challenges such as a high CTE of a thermosetting polymer composite in the related art, a lack of thermal resistance properties and processability due to the high CTE thereof, and the like, the development of an epoxy composite with the improved thermal expansion properties, in other words, low CTE and high glass transition temperature properties, is required.

DISCLOSURE

Technical Problem

An aspect of the present disclosure may provide a novel novolac curing agent with an alkoxysilyl group, and having improved thermal resistance properties, in particular, exhibiting a low CTE, and a high glass transition temperature, and excellent flame retardancy, when used in a composite.

An aspect of the present disclosure may also provide a preparing method of a novel novolac curing agent with an alkoxysilyl group, and having improved thermal resistance, in particular, exhibiting a low CTE, and a high glass transition temperature, and excellent flame retardancy, when used in a composite.

An aspect of the present disclosure may also provide a composition including a novel novolac curing agent with an alkoxysilyl group, having improved thermal resistance, in particular, exhibiting a low CTE, and a high glass transition temperature, and excellent flame retardancy, when used in a composite.

Further, an aspect of the present disclosure may also provide a cured article of a composition including a novel novolac curing agent with an alkoxysilyl group, and having improved thermal resistance, in particular, exhibiting a low CTE, and a high glass transition temperature, and excellent flame retardancy, when used in a composite.

In addition, an aspect of the present disclosure may also provide an application of a composition including a novel novolac curing agent with an alkoxysilyl group according to the aspect of the present disclosure.

Technical Solution

According to a first aspect of the present disclosure, a novolac curing agent with at least one alkoxysilyl group selected from the group consisting of Formulae I-1 to I-4, may be provided.

[Formula I-1]
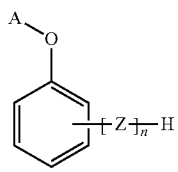
In Formula I-1, Z is one selected from the group consisting of Formulae 1A to 1F:
1A
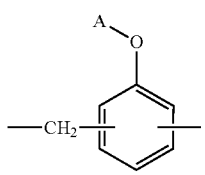
1B
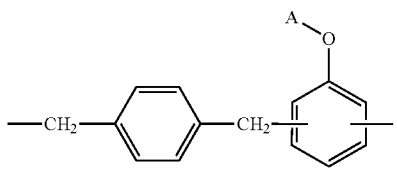
1C
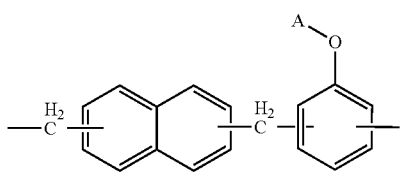
1D
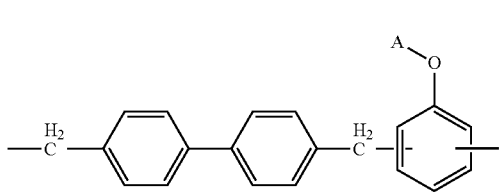
1E
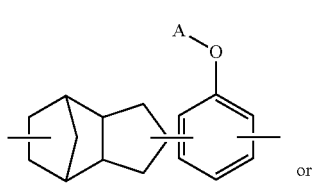
or
1F
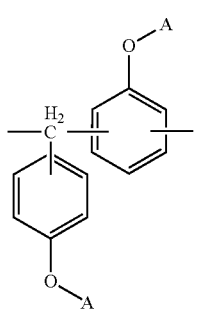
[Formula I-2]
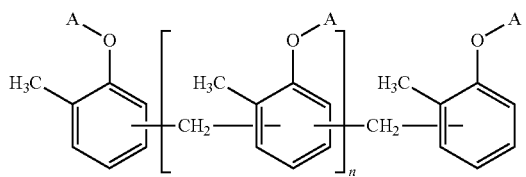
[Formula I-3]
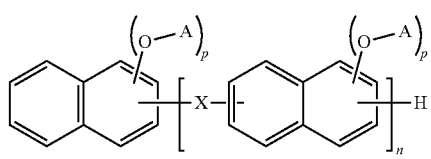
; and
[Formula I-4]
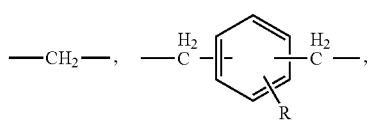
In Formula I-4, p is 1 or 2, x is
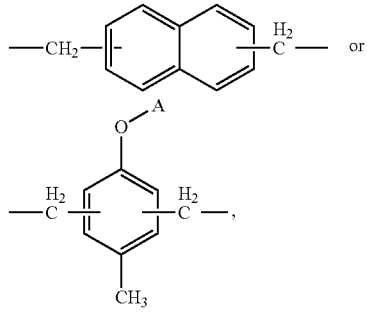
or
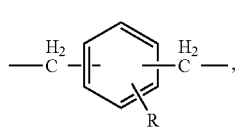
and in
—CH$_2$—[benzene]—CH$_2$—
R is a linear or branched alkyl group of C1-C10.
In Formulae I-1 to I-4, at least one of A's is Formula A2 or A3. In the case that at least one of A's is A2, the remainder of A's is Formula B2 or hydrogen, and in the case that at least one of A's is A3, the remainder of A's is hydrogen, and n is an integer of 1 or more.

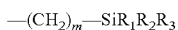  [Formula A2]

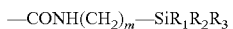  [Formula A3]

In Formulae A2 and A3, at least one of $R_1$ to $R_3$ is a linear or branched alkoxy group of 1 to 5 carbon atoms, the remainder thereof is a linear or branched alkyl group of 1 to 10 carbon atoms, and m is an integer from 3 to 10.

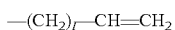  [Formula B2]

In Formula B2, l is an integer from 1 to 8.

According to a second aspect of the present disclosure, a preparing method of a novolac curing agent with at least one alkoxysilyl group selected from the group consisting of Formulae I-1 to I-4 may be provided. The preparing method includes a first step of preparing one of intermediates of Formulae IB-1 to IB-4 by reacting one of starting materials of Formulae IA-1 to IA-4 and an alkenyl compound of Formula II in the presence of a base and an optional solvent; and a second step of preparing one of compounds of Formulae I-1 to I-4 with a structure of Formula A2 by reacting one of intermediates of Formulae IB-1 to IB-4 and alkoxysilane of Formula IIIA in the presence of a platinum catalyst and an optional solvent.

[Formula IA-1]

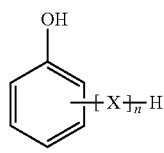

In the above Formula IA-1, X is one selected from the group consisting of Formulae 2A to 2F.

2A

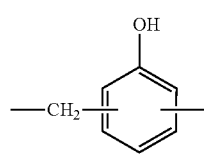

2B

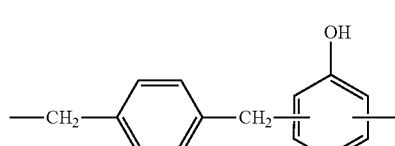

2C

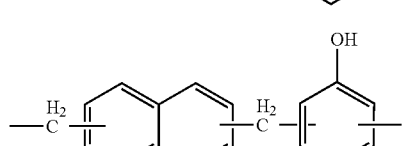

2D

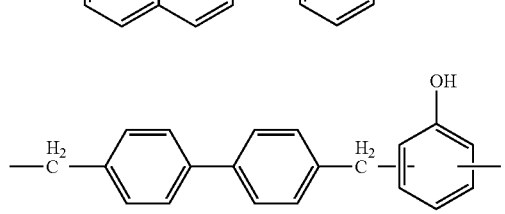

2E

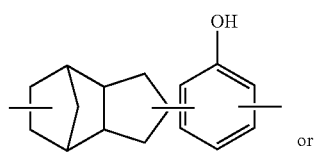

or

2F

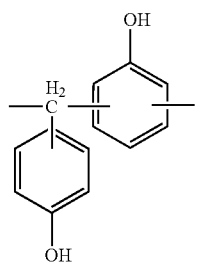

[Formula IA-2]

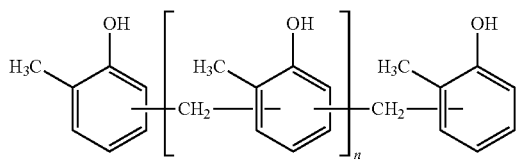

[Formula IA-3]

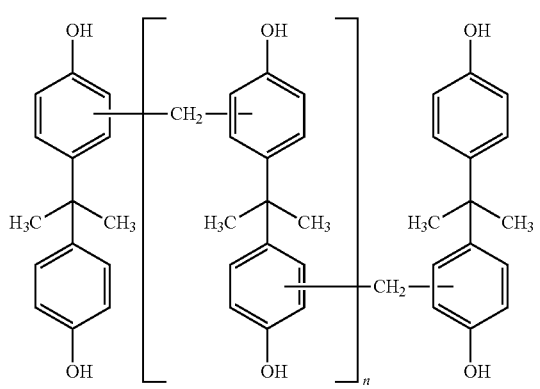

[Formula IA-4]

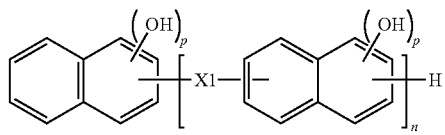

In Formula IA-4, p is 1 or 2, x1 is

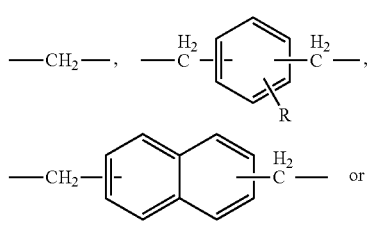

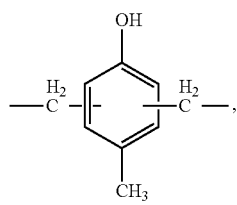
and in
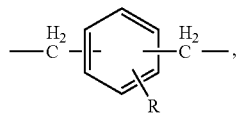
R is a linear or branched alkyl group of C1-C10.
In Formulae IA-1 to IA-4, n is an integer of 1 or more.
[Formula IB-1]
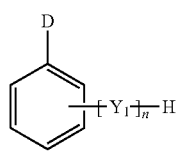
In Formula IB-1, $Y_1$ is one selected from the group consisting of Formulae 3A to 3F.
3A
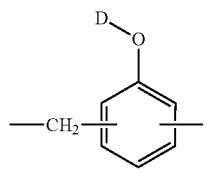
3B
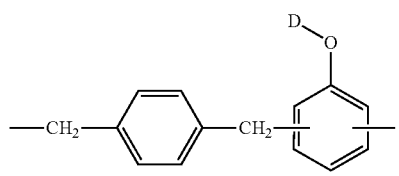
3C
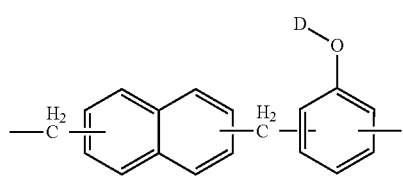
3D
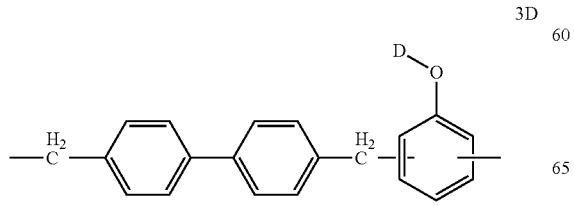
3E
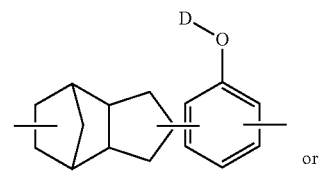
or
3F
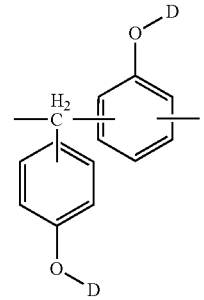
[Formula IB-2]
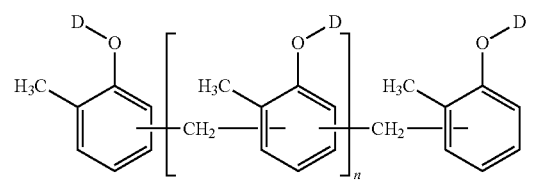
[Formula IB-3]
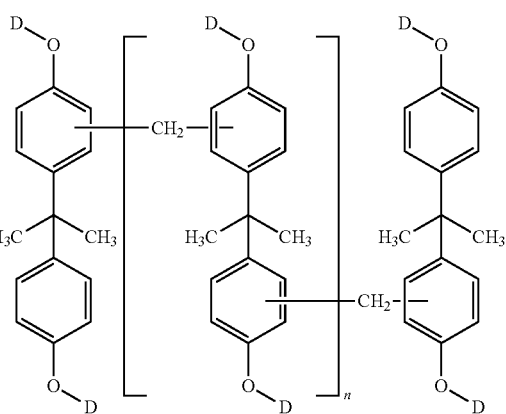
[Formula IB-4]
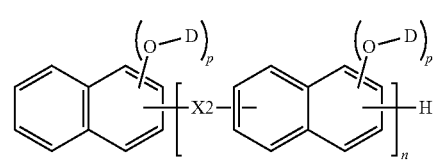
In Formula IB-4, p is 1 or 2, x2 is
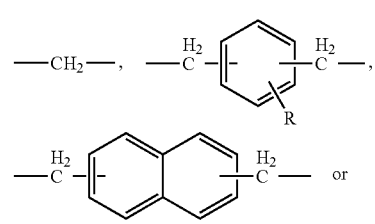
or

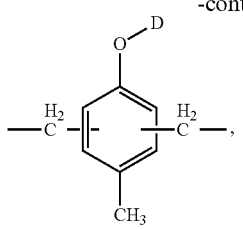

and in

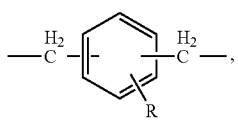

R is a linear or branched alkyl group of C1-C10.

In Formulae IB-1 to IB-4, at least one of D's may be Formula B2, the remainder of D's may be hydrogen, and n is an integer of 1 or more.

—(CH$_2$)$_l$—CH=CH$_2$  [Formula B2]

In Formula B2, l is an integer from 1 to 8.

X—(CH$_2$)$_l$—CH=CH$_2$  [Formula II]

In Formula II, l is an integer from 1 to 8, X is Cl, Br, I, —O—SO$_2$—CH$_3$, —O—SO$_2$—CF$_3$, or —O—SO$_2$—C$_6$H$_4$—CH$_3$.

HSiR$_a$R$_b$R$_c$  [Formula IIIA]

In Formula IIIA, at least one of R$_a$ to R$_c$ is a linear or branched alkoxy group of C1-C5, and the remainder thereof is a linear or branched alkyl group of C1-C10.

[Formula I-1]

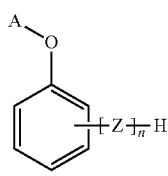

In Formula I-1, Z is one selected from the group consisting of Formulae 1A to 1F.

1A

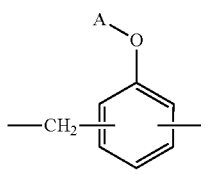

1B

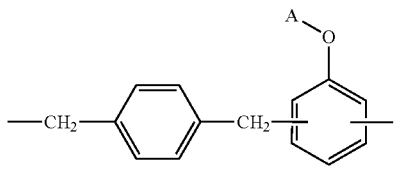

1C

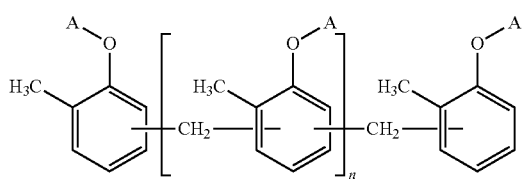

1D

1E or

1F

[Formula I-2]

[Formula I-3]

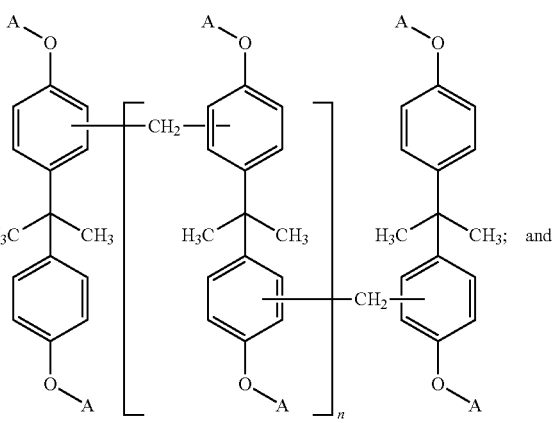

-continued

[Formula I-4]

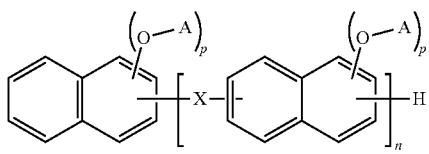

In Formula I-4, p is 1 or 2, X is

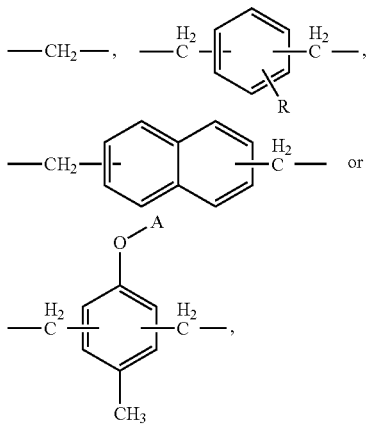

and in

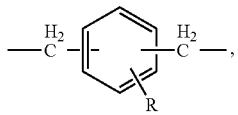

R is a linear or branched alkyl group of C1-C10.

In Formulae I-1 to I-4, at least one of A's is Formula A2, the remainder of A's is Formula B2 or hydrogen, and n is an integer of 1 or more.

$-(CH_2)_m-SiR_1R_2R_3$  [Formula A2]

In Formula A2, at least one of $R_1$ to $R_3$ is a linear or branched alkoxy group of 1 to 5 carbon atoms, the remainder thereof is a linear or branched alkyl group of 1 to 10 carbon atoms, and m is an integer from 3 to 10.

$-(CH_2)_l-CH=CH_2$  [Formula B2]

In Formula B2, l is an integer from 1 to 8.

According to a third aspect of the present disclosure, a reaction in the first step may be performed using 0.1 to 10 equivalents of an alkylene group of the alkenyl compound of Formula II with respect to 1 equivalent of a hydroxyl group of one of starting materials of Formulae IA-1 to IA-4 in the preparing method of the novolac curing agent with an alkoxysilyl group according to the second aspect.

According to a fourth aspect of the present disclosure, a reaction in the first step may be performed at a temperature of from −20° C. to 100° C. for 1 hour to 120 hours in the preparing method of the novolac curing agent with an alkoxysilyl group according to the second aspect.

According to a fifth aspect of the present disclosure, a reaction in the second step may be performed using 0.1 to 5 equivalents of alkoxysilane with respect to 1 equivalent of an alkenyl group of one of intermediates of Formulae IB-1 to IB-4 in the preparing method of the novolac curing agent with an alkoxysilyl group according to the second aspect.

According to a sixth aspect of the present disclosure, a reaction in the second step may be performed at a temperature of from −20° C. to 120° C. for 1 hour to 72 hours in the preparing method of the novolac curing agent with an alkoxysilyl group according to the second aspect.

According to a seventh aspect of the present disclosure, a preparing method of a novolac curing agent with at least one alkoxysilyl group selected from the group consisting of Formulae I-1 to I-4 may be provided. The preparing method includes an alkoxysilylation step of preparing one of compounds of Formulae I-1 to I-4 with a structure of Formula A3 by reacting one of starting materials of Formulae IA-1 to IA-4 and alkoxysilane of Formula IIIB in the presence of an optional base and an optional solvent.

[Formula IA-1]

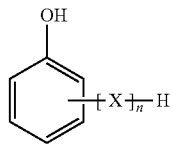

In Formula IA-1, X is one selected from the group consisting of Formulae 2A to 2F.

2A

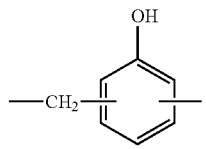

2B

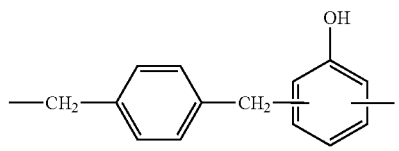

2C

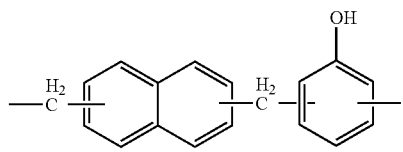

2D

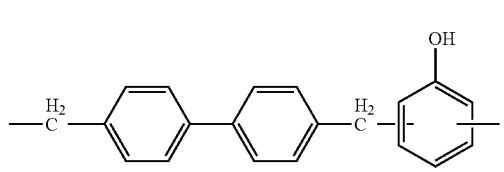

2E

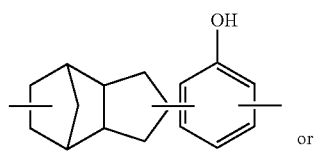

or

-continued

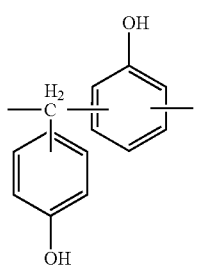

[Formula IA-2]

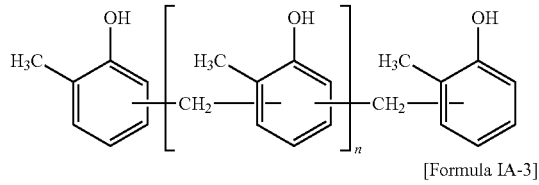

[Formula IA-3]

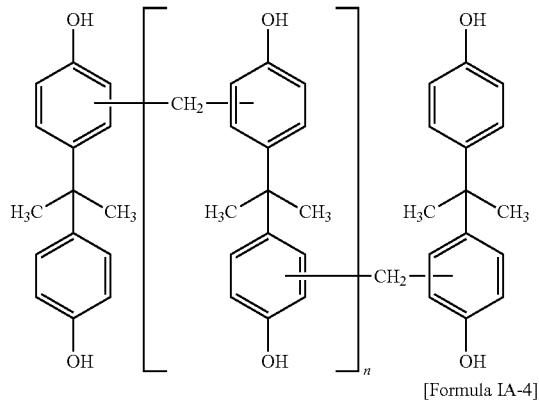

[Formula IA-4]

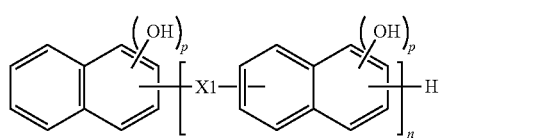

In Formula IA-4, p is 1 or 2, x1 is

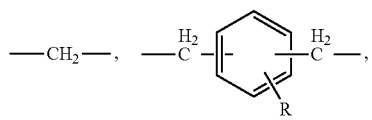

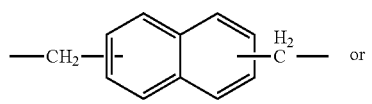

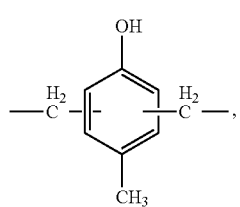

and in

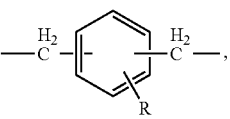

2F

R is a linear or branched alkyl group of C1-C10.
In Formulae IA-1 to IA-4, n is an integer of 1 or more.

$$OCN-(CH_2)_m-SiR_1R_2R_3 \quad \text{[Formula IIIB]}$$

In Formula IIIB, at least one of $R_1$ to $R_3$ is a linear or branched alkoxy group of 1 to 5 carbon atoms, the remainder thereof is a linear or branched alkyl group of 1 to 10 carbon atoms, and m is an integer from 3 to 10.

[Formula I-1]

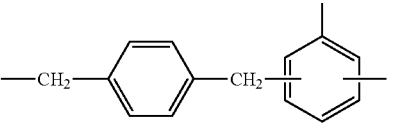

In Formula I-1, Z is one selected from the group consisting of Formulae 1A to 1F.

1A

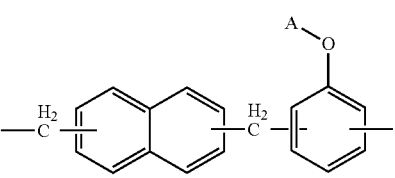

1B

1C

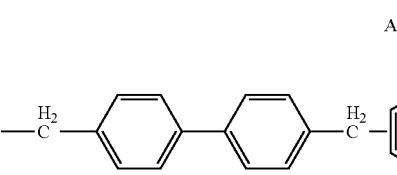

1D

1E

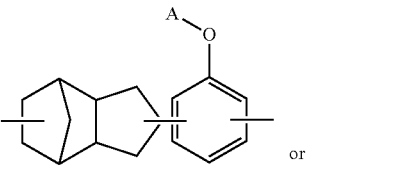

or

-continued

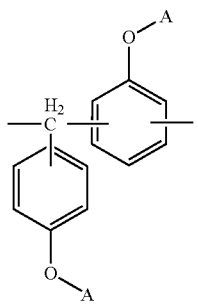

[Formula I-2]

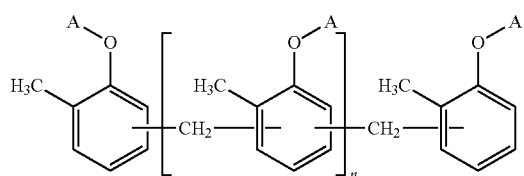

[Formula I-3]

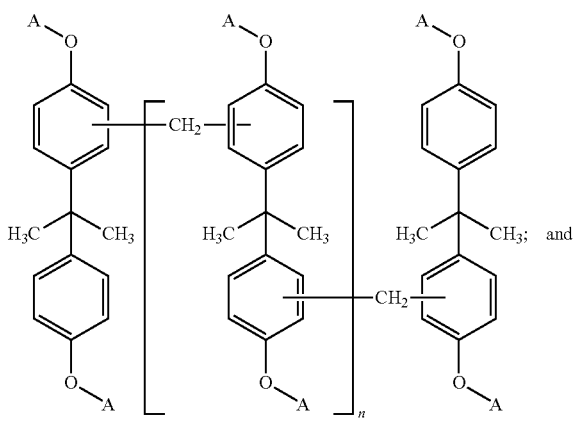

[Formula I-4]

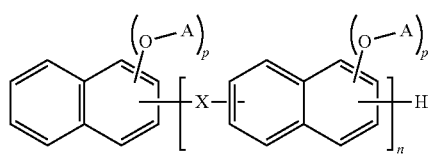

In Formula I-4, p is 1 or 2, x is

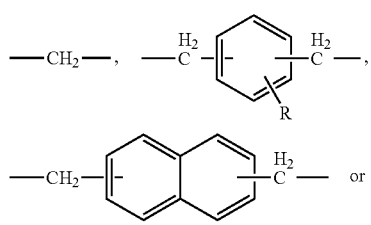

-continued

1F

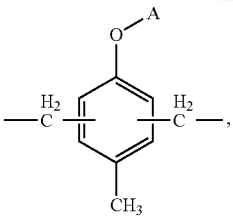

and in

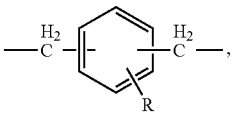

R is a linear or branched alkyl group of C1-C10.

In Formulae I-1 to I-4, at least one of A's is Formula A3, the remainder of A is hydrogen, and n is an integer of 1 or more.

—CONH(CH$_2$)$_m$—SiR$_1$R$_2$R$_3$      [Formula A3]

In Formula A3, at least one of R$_1$ to R$_3$ is a linear or branched alkoxy group of 1 to 5 carbon atoms, the remainder thereof is a linear or branched alkyl group of 1 to 10 carbon atoms, and m is an integer from 3 to 10.

According to an eighth aspect of the present disclosure, a reaction in the alkoxysilylation step may be performed by using 0.1 to 5 equivalents of alkoxysilane with respect to 1 equivalent of a hydroxyl group of one of starting materials of Formulae IA-1 to IA-4 in the preparing method of the novolac curing agent with an alkoxysilyl group according to the seventh aspect.

According to a ninth aspect of the present disclosure, a reaction in the alkoxysilylation step may be performed at a temperature of −20° C. to 120° C. for 1 hour to 72 hours in the preparing method of the novolac curing agent with an alkoxysilyl group according to the seventh aspect.

According to a tenth aspect of the present disclosure, a composition including an epoxy resin and a novolac curing agent with at least one alkoxysilyl group selected from the group consisting of Formulae I-1 to I-4 may be provided.

[Formula I-1]

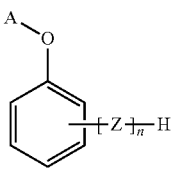

In Formula I-1, Z is one selected from the group consisting of Formulae 1A to 1F.

1A

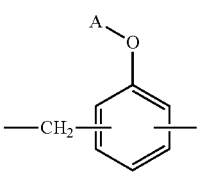

1B
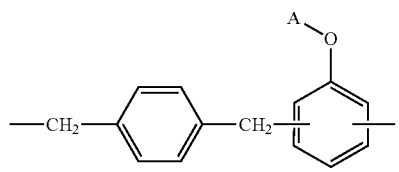

1C
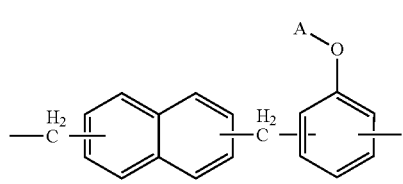

1D
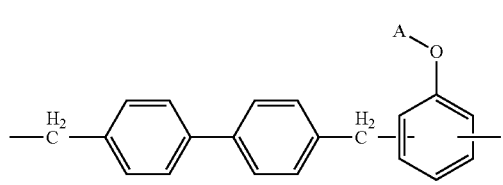

1E
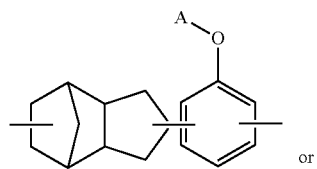

or

1F
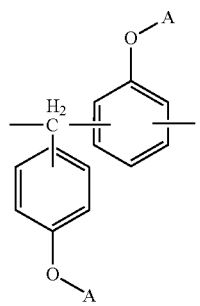

[Formula I-2]

[Formula I-3]
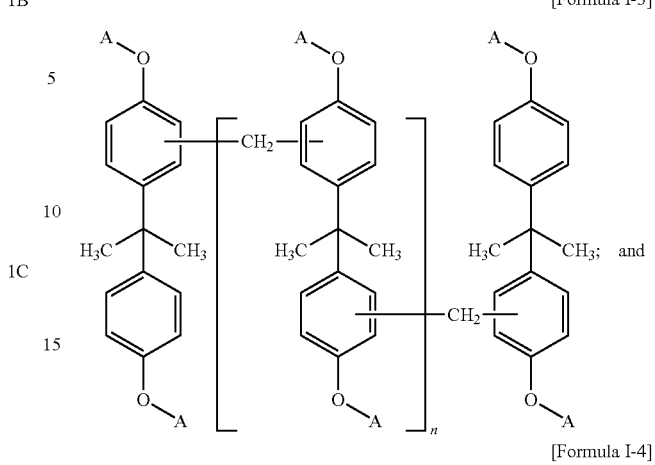

[Formula I-4]
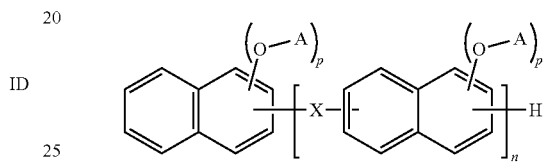

In Formula I-4, p is 1 or 2, x is

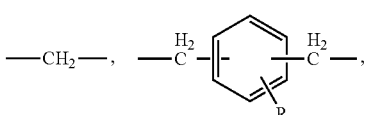

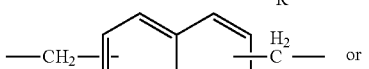

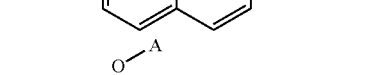

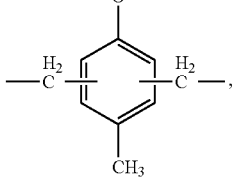

and in

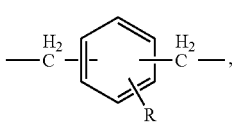

R is a linear or branched alkyl group of C1-C10.

In Formulae I-1 to I-4, at least one of A's is Formula A2 or A3, in the case that at least one of A's is A2, the remainder of A's is Formula B2 or hydrogen, and in the case that at least one of A's is A3, the remainder of A's is hydrogen, n is an integer of 1 or more.

   [Formula A2]

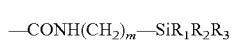   [Formula A3]

In Formulae A2 and A3, at least one of $R_1$ to $R_3$ is a linear or branched alkoxy group of 1 to 5 carbon atoms, the remainder thereof is a linear or branched alkyl group of 1 to 10 carbon atoms, and m is an integer from 3 to 10.

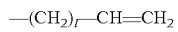 [Formula B2]

In Formula B2, l is an integer from 1 to 8.

According to an eleventh aspect of the present disclosure, the epoxy resin may be at least one selected from the group consisting of a glycidyl ether-based epoxy resin, a glycidyl-based epoxy resin, a glycidyl amine-based epoxy resin, and a glycidyl ester-based epoxy resin in the composition according to the tenth aspect.

According to a twelfth aspect of the present disclosure, the epoxy resin may include bisphenol, biphenyl, naphthalene, benzene, thiodiphenol, fluorene, anthracene, isocyanurate, triphenylmethane, 1,1,2,2-tetraphenylethane, triphenylmethane, 4,4'-diaminodiphenylmethane, aminophenol, an alicyclic compound, an aliphatic compound, or a novolac unit, as a core structure in the composition according to the eleventh aspect.

According to a thirteenth aspect of the present disclosure, the epoxy resin may or may not include an alkoxysilyl group in the composition according to the eleventh or twelfth aspect.

According to a fourteenth aspect of the present disclosure, as a filler, inorganic particles or/and a fiber may be further included in the composition according to the tenth aspect.

According to a fifteenth aspect of the present disclosure, the inorganic particles may be at least one selected from the group consisting of silica, zirconia, titania, alumina, silicon nitride, aluminum nitride, and silsesquioxane in the composition according to the fourteenth aspect.

According to a sixteenth aspect of the present disclosure, an amount of the inorganic particles may be 5 wt % to 95 wt % based on a total solids content of the composition in the composition according to the fourteenth aspect.

According to a seventeenth aspect of the present disclosure, an amount of the inorganic particles may be 30 wt % to 95 wt % based on a total solids content of the composition in the composition according to the sixteenth aspect.

According to an eighteenth aspect of the present disclosure, an amount of the inorganic particles may be 5 wt % to 60 wt % based on a total solids content of the composition in the composition according to the sixteenth aspect.

According to a nineteenth aspect of the present disclosure, the fiber may be at least one selected from the group consisting of a glass fibers selected from the group consisting of an E-glass fiber, a T-glass fiber, an S-glass fiber, an NE-glass fiber, an H-glass fiber, and quartz; and an organic fibers selected from the group consisting of a liquid crystal polyester fiber, a polyethyleneterephthalate fiber, a wholly aromatic fiber, a polybenzoxazole fiber, a nylon fiber, a polyethylene naphthalate fiber, a polypropylene fiber, a polyether sulfone fiber, a polyvinylidene fluoride fiber, a polyethylene sulfide fiber, and a polyether ether ketone fiber in the composition according to the fourteenth aspect.

According to a twentieth aspect of the present disclosure, the fiber may be an E-glass fiber in the composition according to the nineteenth aspect.

According to a twenty-first aspect of the present disclosure, the fiber may be a T-glass fiber in the composition according to the nineteenth aspect.

According to a twenty-second aspect of the present disclosure, an amount of the fiber may be 10 wt % to 90 wt % based on a total solids content of the composition in the composition according to the fourteenth aspect.

According to a twenty-third aspect of the present disclosure, inorganic particles may be further included in the case that a fiber is included as the filler in the composition according to the fourteenth aspect.

According to a twenty-fourth aspect of the present disclosure, an alkoxysilyl group reaction catalyst may be further included in the composition according to the tenth aspect.

According to a twenty-fifth aspect of the present disclosure, the alkoxysilyl group reaction catalyst may be at least one selected from the group consisting of nitric acid, sulfuric acid, hydrochloric acid, acetic acid, phosphoric acid, ammonia, KOH, NH$_4$OH, amine, a transition metal alkoxide, and a tin compound in the composition according to the twenty-fourth aspect.

According to a twenty-sixth aspect of the present disclosure, the reaction catalyst may be used by 0.01 phr to 10 phr based on the epoxy resin with an alkoxysilyl group in the composition according to the twenty-fourth aspect.

According to a twenty-seventh aspect of the present disclosure, water may be further included in the composition according to the twenty-fourth aspect.

According to a twenty-eighth aspect of the present disclosure, an electronic material including the composition according to any one of the tenth to twenty-seventh aspects, may be provided.

According to a twenty-ninth aspect of the present disclosure, a substrate including the composition according to any one of the tenth to twenty-seventh aspects, may be provided.

According to a thirtieth aspect of the present disclosure, a film including the composition according to any one of the tenth to twenty-seventh aspects, may be provided.

According to a thirty-first aspect of the present disclosure, a laminated plate including a metal layer placed on a base layer formed by using one composition according to any one of the tenth to twenty-seventh aspects, may be provided.

According to a thirty-second aspect of the present disclosure, a printed circuit board including the laminated plate according to the thirty-first aspect, may be provided.

According to a thirty-third aspect of the present disclosure, a semiconductor device including the printed circuit board according to the thirty-second aspect, may be provided.

According to a thirty-fourth aspect of the present disclosure, a semiconductor packaging material including the composition according to any one of the tenth to twenty-seventh aspects, may be provided.

According to a thirty-fifth aspect of the present disclosure, a semiconductor device including the semiconductor packaging material according to the thirty-fourth aspect, may be provided.

According to a thirty-sixth aspect of the present disclosure, an adhesive including the composition according to any one of the tenth to twenty-seventh aspects, may be provided.

According to a thirty-seventh aspect of the present disclosure, a paint including the composition according to any one of the tenth to twenty-seventh aspects, may be provided.

According to a thirty-eighth aspect of the present disclosure, a composite material including the composition according to any one of the tenth to twenty-seventh aspects, may be provided.

According to a thirty-ninth aspect of the present disclosure, a prepreg including the composition according to any one of the tenth to twenty-seventh aspects, may be provided.

According to a fortieth aspect of the present disclosure, a laminated plate including a metal layer placed on the prepreg according to the thirty-ninth aspect, may be provided.

According to a forty-first aspect of the present disclosure, a cured article of the composition according to any one of the tenth to twenty-seventh aspects, may be provided.

According to a forty-second aspect of the present disclosure, a cured article formed of the composition which may have a CTE of 60 ppm/° C. or less according to the forty-first aspect, may be provided.

According to a forty-third aspect of the present disclosure, a cured article formed of the composition which may have a glass transition temperature above 100° C., or may not exhibit a glass transition temperature according to the forty-first aspect, may be provided.

Advantageous Effects

According to an exemplary embodiment in the present disclosure, due to the formation of interfacial bonding between an alkoxysilyl group and a filler (a fiber and/or inorganic particles), and additional chemical bonding by a reaction of an alkoxysilyl group with epoxy and a curing agent, in a composite and/or a cured article, a composition including a novel novolac curing agent with an alkoxysilyl group may have improved thermal resistance properties. In other words, a CTE of the epoxy composite may be decreased, and a glass transition temperature may be increased or a glass transition temperature may not be exhibited (hereinafter, referred to as 'Tg-less').

Further, according to an exemplary embodiment in the present disclosure, a cured article formed of a composition including a novolac curing agent with an alkoxysilyl group may exhibit excellent flame retardancy due to introduction of an alkoxysilyl group.

In addition, according to an exemplary embodiment in the present disclosure, in comparison with an epoxy resin with an alkoxysilyl group, a novel novolac curing agent with an alkoxysilyl group may have the solid phase easily, whereby the novel novolac curing agent may be easily applied to a process requiring an solid sample, and brittleness and adhesive properties of a cured article may be improved.

Further, according to an exemplary embodiment in the present disclosure, in a case in which a composition is applied to a metal film of a substrate, excellent adhesive properties may be exhibited by chemical bonding between a functional group in a surface of the metal film and an alkoxysilyl group.

DESCRIPTION OF DRAWINGS

FIG. 1 is results of measuring the change of the length with respect to the temperature of a glass fiber composite according to Example 1 and Comparative Example 1.

BEST MODE FOR INVENTION

The present disclosure provides a novel novolac curing agent with an alkoxysilyl group, and having improved thermal resistance properties, in particular, exhibiting a low CTE, and a high Tg (including Tg less) when a composite is formed by using a composition including a curing agent with an alkoxysilyl group, and/or excellent flame retardancy in a cured article, a preparing method of the same, a composition including the same, a cured article thereof, and a use thereof.

In the present disclosure, "composite or epoxy composite" refers to a cured article formed by using a composition including an epoxy resin, a curing agent, and a filler (a fiber and/or inorganic particles). In the present disclosure, "cured article or epoxy cured article" refers to a cured article formed of a composition including an epoxy resin and a curing agent as having a general meaning, for example, a cured article formed of a composition including at least one selected from the group consisting of a filler, an optional and additional curing agent, and an optional curing catalyst and other additives in addition to the epoxy resin and the curing agent. In addition, the cured article may include a half-cured article. Generally, a cured article reinforced with inorganic particles and/or a fiber is known as a composite, and the cured article has a wider meaning than the composite. However, the cured article reinforced with inorganic particles and/or a fiber may be understood to have the same meaning as the composite.

When a composite is formed by curing, as interfacial bonding between an alkoxysilyl group and a surface of a filler (a fiber and/or inorganic particles) and/or chemical bonding of an alkoxysilyl group with an epoxide group and a phenol group may be formed, whereby a novel novolac curing agent according to an exemplary embodiment in the present disclosure may exhibit a low CTE and an increasing of high glass transition temperature or Tg-less. Thus, dimensional stability may be improved. In addition, a cured article including a novolac curing agent according to an exemplary embodiment in the present disclosure may exhibit excellent flame retardancy.

Further, when a composition according to an exemplary embodiment in the present disclosure is applied to a metal film which is chemically treated, for example, a copper foil or the like, an alkoxysilyl group of a curing agent is chemically bonded to an —OH group or the like in a metal surface by metal surface treatment, whereby the composition may exhibit excellent adhesiveness with the metal film.

1. Novolac Curing Agent with Alkoxysilyl Group

According to an embodiment in the present disclosure, a novolac curing agent with an alkoxysilyl group selected from the group consisting of Formulae I-1 to I-4 is provided.

[Formula I-1]

In Formula I-1, Z is one selected from the group consisting of Formulae 1A to 1F.

1A

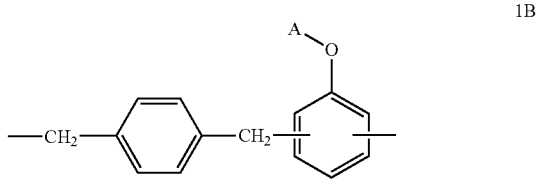

1B

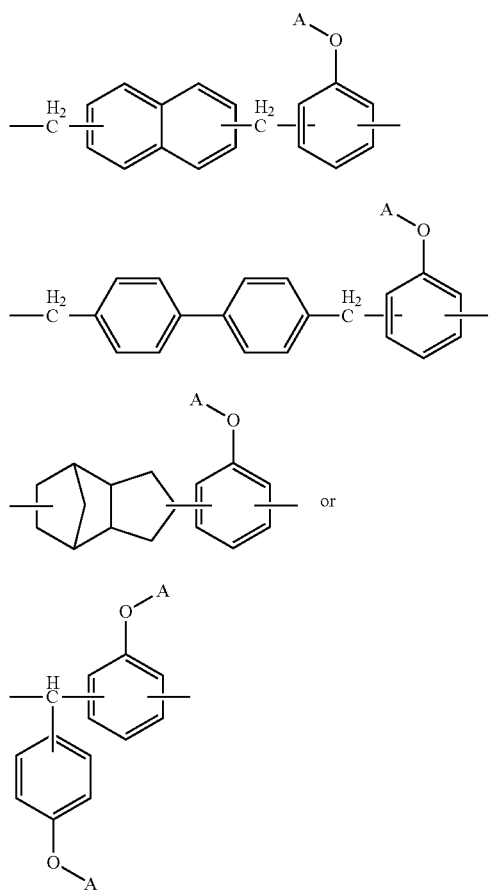

[Formula I-2]

[Formula I-3]

[Formula I-4]

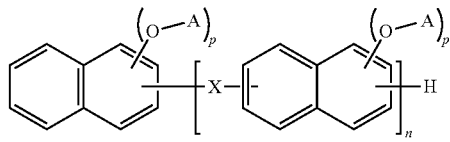

In Formula I-4, p is 1 or 2, x is

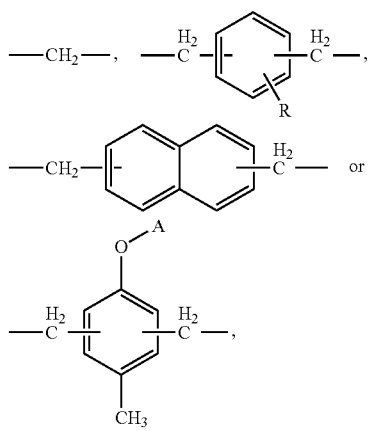

and in

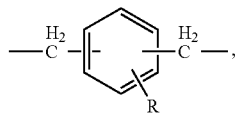

R is a linear or branched alkyl group of C1-C10.

In Formulae I-1 to I-4, at least one of a plurality of A is Formula A2 or A3, where in the case that at least one of A's is A2, the remainder of A's is Formula B2 or hydrogen, and in the case that at least one of A's is A3, the remainder of A's is hydrogen, n is 1 or more, for example, an integer of 1 to 1000.

$$—(CH_2)_m—SiR_1R_2R_3 \quad \text{[Formula A2]}$$

$$—CONH(CH_2)_m—SiR_1R_2R_3 \quad \text{[Formula A3]}$$

In Formulae A2 and A3, at least one of $R_1$ to $R_3$ is an alkoxy group of 1 to 5 carbon atoms, and preferably, an alkoxy group of 1 to 3 carbon atoms, and more preferably, a methoxy group or an ethoxy group, the remainder thereof is an alkyl group of 1 to 10 carbon atoms, and m is an integer of 3 to 10, and preferably, an integer of 3 to 6. The alkoxy group and alkyl group may be a linear or a branched.

$$—(CH_2)_l—CH{=}CH_2 \quad \text{[Formula B2]}$$

In Formula B2, l is an integer from 1 to 8.

In the novolac curing agent with an alkoxysilyl group according to an embodiment in the present disclosure, and in Formulae A2 and A3, at least one of alkoxy groups of $R_1$ to $R_3$ may preferably be a methoxy group in consideration of reactivity improvement, and at least one of alkoxy groups of $R_1$ to $R_3$ may preferably be an ethoxy group in consideration of reaction stability, in other words, stability of agent and/or excellent reactivity.

In the present application, "alkoxy group" denotes a monovalent group of —OR (R is an alkyl group) and may be a linear or a branched. In the present application, a branched and a side chain may be used interchangeably.

In the present application, "alkyl group" denotes a monovalent hydrocarbon group and may be a linear or a branched, and preferably, has 1 to 10 carbon atoms, and more preferably, has 1 to 5 carbon atoms.

Further, according to an embodiment in the present disclosure, a composite formed of a composition including a novolac curing agent with an alkoxysilyl group exhibits a low CTE, and a high glass transition temperature or Tg-less.

2. Preparing Method of Novolac Curing Agent with Alkoxysilyl Group

The novolac curing agent with an alkoxysilyl group of Formulae I-1 to I-4 according to an embodiment in the present disclosure may be synthesized by the following methods. A preparing method of a novolac curing agent with an alkoxysilyl group to be described later is relatively easy and simple in comparison with a preparing method of an epoxy resin with an alkoxysilyl group.

(1) Preparing method of novolac curing agent with alkoxysilyl group of Formulae I-1 to I-4 modified with Formula A2 (Method 1)

According to another embodiment in the present disclosure, a preparing method of a novel novolac curing agent of Formulae I-1 to I-4 containing a substituent of Formula A2 is provided. The novel novolac curing agent containing the substituent of Formula A2 may be prepared via alkenylation of a starting material (first step) and alkoxysilylation (second step).

In the first step, through the reaction of any one of starting materials of Formulae IA-1 to IA-4 (hereinafter, 'starting material' or 'starting material IA'), and an alkenyl compound of Formula II, at least one of hydroxyl groups in the starting materials may be alkenylated to form any one of intermediates of Formulae IB-1 to IB-4 (hereinafter, 'intermediate IB').

[Formula IA-1]

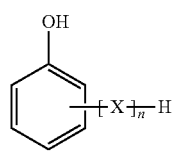

In Formula IA-1, X is one selected from the group consisting of Formulae 2A to 2F.

2A

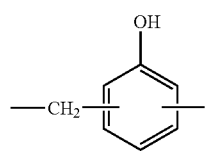

2B

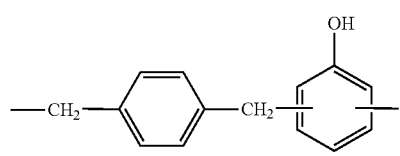

2C

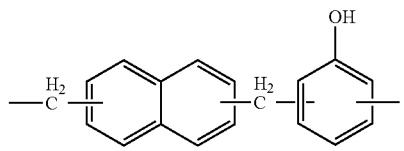

2D

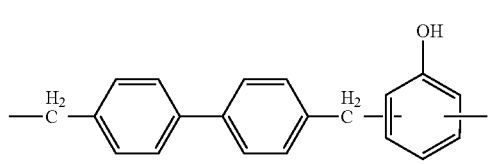

2E

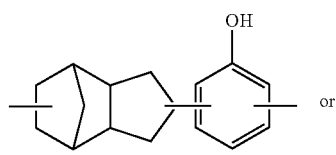

or

2F

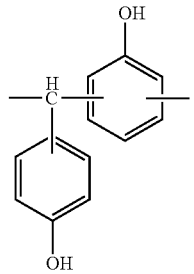

[Formula IA-2]

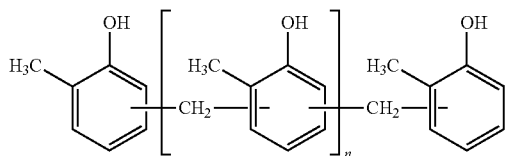

[Formula IA-3]

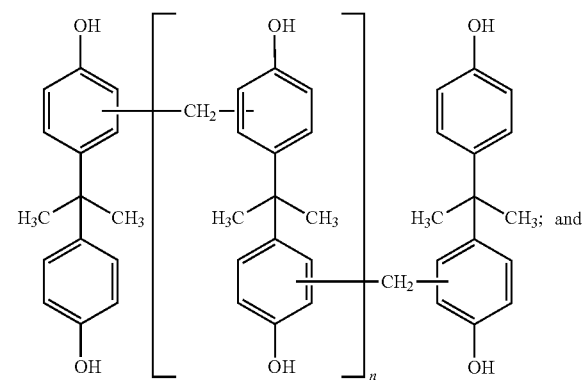

and

[Formula IA-4]

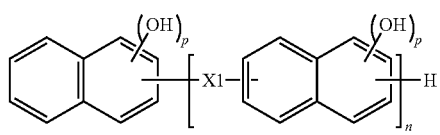

In Formula IA-4, x1 is

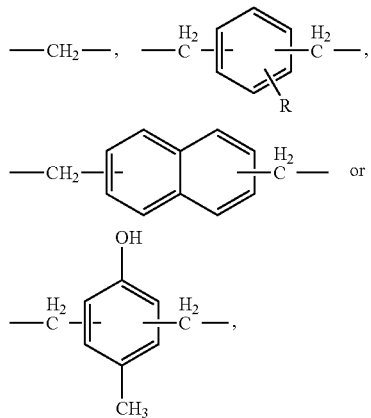

and in

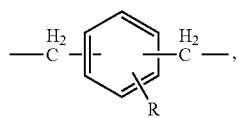

R is a linear or branched alkyl group of C1-C10.

In Formulae IA-1 to IA-4, n is an integer of 1 or more.

Particularly, in Formulae IA-1 to IA-4, n is an integer of 1 or more, for example, an integer of 1 to 1000, and includes all integers in the range and an integer in another smaller range.

In Formula IA-4, p is 1 or 2.

[Formula IB-1]

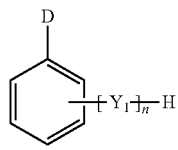

In Formula IB-1, $Y_1$ is one selected from the group consisting of Formulae 3A to 3F.

3A

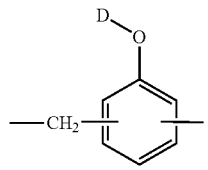

3B

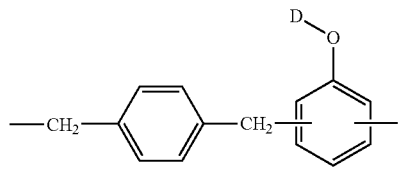

-continued

3C

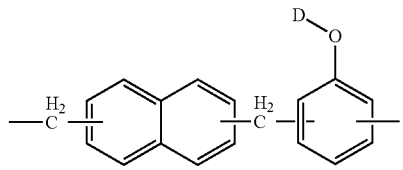

3D

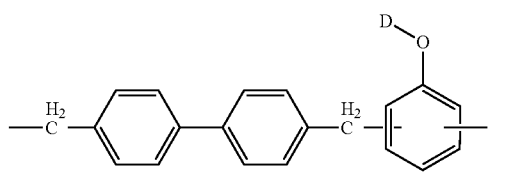

3E

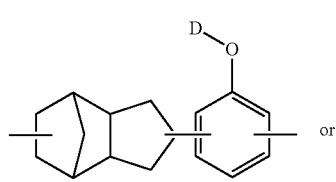

or

3F

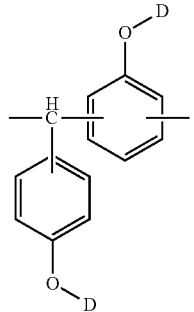

[Formula IB-2]

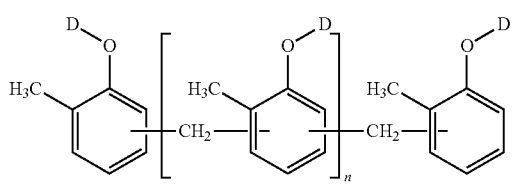

[Formula IB-3]

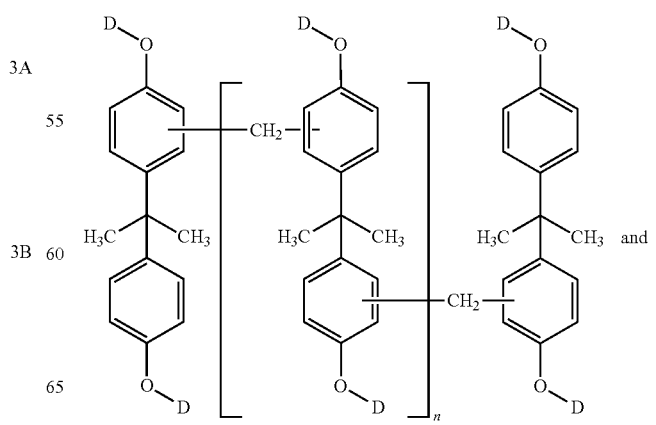

and

[Formula IB-4]

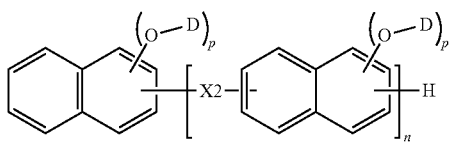

In Formula IB-4, x2 is

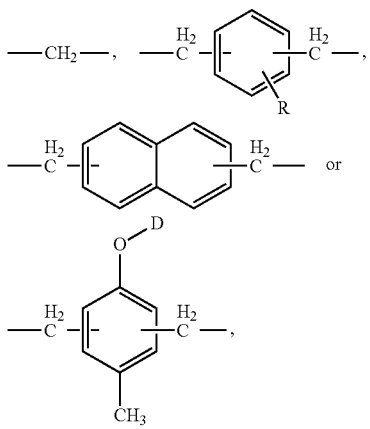

and in

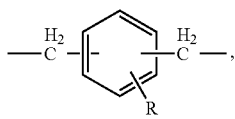

R is a linear or branched alkyl group of C1-C10.

In Formulae IB-1 to IB-4, at least one of a plurality of D may be Formula B2, the remainder D may be hydrogen, and n is an integer of 1 or more.

In Formula IB-4, p is 1 or 2.

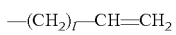           [Formula B2]

In Formula B2, l is an integer of 1 to 8, and preferably, an integer of 1 to 4.

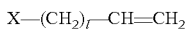           [Formula II]

In Formula II, l is an integer of 1 to 8, and preferably, an integer of 1 to 4, and X is a halide such as Cl, Br, or I, —O—SO$_2$—CH$_3$, —O—SO$_2$—CF$_3$, or —O—SO$_2$—C$_6$H$_4$—CH$_3$.

The alkenylation in the first step is performed by reacting one starting material of Formulae IA-1 to IA-4, and the alkenyl compound of Formula II, and such a reaction may be performed in the presence of a base and an optional solvent. For example, the reaction of the starting material and the alkenyl compound is performed so that 0.1 to 10 equivalents of an alkenyl group in the alkenyl compound with respect to 1 equivalent of the hydroxyl group of the starting material may react, in the presence of a base and an optional solvent, to produce an intermediate IB. The reacting material reacts according to equivalent ratios on the basis of stoichiometry, and through the reaction of the reacting materials by the equivalent ratio, the intermediate IB is obtained.

The reaction temperature and the reaction time of the first step may be changed depending on the type of reacting materials, for example, at a temperature of from −20° C. to 100° C. for 1 hour to 120 hours to produce the intermediate IB.

The available base may include, for example, KOH, NaOH, K$_2$CO$_3$, Na$_2$CO$_3$, KHCO$_3$, NaHCO$_3$, NaH, triethylamine, diisopropylethylamine, without limitation. These bases may be used alone or as a combination of two or more thereof. 0.1 to 5 equivalents of the base may be used with respect to 1 equivalent of the hydroxyl group of the starting material IA in consideration of reaction efficiency.

A solvent used in the reaction of the first step may be any solvent as occasion demands. For example, a solvent may not be used in a case in which viscosity of the reacting material at the reaction temperature is appropriate for carrying out the reaction without using a separate solvent in the first step reaction. That is, a separate solvent is not required in the case in which the viscosity of the reacting material is sufficiently low, and mixing and stirring of the reacting material may be easily performed without a solvent. This may be easily determined by a person skilled in the art. In the case in which a solvent is used, any organic solvent may be used, as an available solvent, if able to dissolve the reacting material properly, not inducing any adverse influence to the reaction, and being easily removed after the reaction. For example, acetonitrile, tetrahydrofuran (THF), methyl ethyl ketone (MEK), dimethyl formamide (DMF), dimethyl sulfoxide (DMSO), methylene chloride (MC), H$_2$O, alcohols, toluene, or the like may be used without specific limitation. These solvents may be used alone or as a mixture of two or more thereof. The use amount of the solvent may not be limited to being within a specific range, and an appropriate amount and/or concentration of the solvent may be used within a range sufficient for sufficiently dissolving the reacting material and not adversely affecting the reaction. A person skilled in the art may select an appropriate amount and/or concentration of the solvent in consideration of the above-mentioned points.

Thereafter, in the second step, the above intermediate IB is alkoxysilylated to produce a novolac curing agent of Formulae I-1 to I-4 with a substituent A2 according to an embodiment in the present disclosure. Such a reaction may be performed in the presence of a catalyst and an optional solvent, and the catalyst used in this case is preferably a platinum catalyst.

In the reaction of the second step, the reaction of the intermediate IB and alkoxysilane is performed according to the equivalent ratio of the alkenyl group of the intermediate IB and the alkoxysilane on the basis of stoichiometry. Thus, the reaction of the intermediate IB and the alkoxysilane of Formula IIIA is performed so that 0.1 to 5 equivalents of the alkoxysilane of Formula IIIA with respect to 1 equivalent of an alkenyl group of the above intermediate IB may react in consideration of the equivalent ratio.

           [Formula IIIA]

In Formula IIIA, at least one of $R_a$ to $R_c$ is an alkoxy group of C1-C5, and preferably, an alkoxy group of C1-C3, and more preferably, a methoxy group or an ethoxy group, and the remainder thereof is an alkyl group of C1-C10, and the alkoxy group and alkyl group may be a linear or a branched.

The reaction temperature and the reaction time of the second step may be changed depending on the type of reacting material, for example, the reaction may be performed at a temperature of from −20° C. to 120° C. for 1 hour to 72 hours to produce a novolac curing agent of Formulae I-1 to I-4 with a substituent A2.

In the second step, the platinum catalyst may be, for example, $PtO_2$ or chloroplatinic acid ($H_2PtCl_6$), without limitation. $1\times10^{-4}$ to 0.05 equivalents of the platinum catalyst with respect to 1 equivalent of the alkenyl group of the intermediate IB may be preferably used in consideration of reaction efficiency.

The solvent used during the reaction of the second step may be any solvent as occasion demands. For example, a solvent may not be used in a case in which viscosity of the reacting material is appropriate for carrying out the reaction of the second step at the reaction temperature without using a separate solvent. That is, a separate solvent is not required in the case in which viscosity of the reacting material is sufficiently low, and mixing and stirring of the reacting material may be easily performed without a solvent. This may be determined by a person skilled in the art. In the case in which a solvent is used, any aprotic solvents may be used, as an available solvent, if able to dissolve the reacting material properly, not inducing any adverse influence to the reaction, and being easily removed after the reaction. For example, toluene, acetonitrile, tetrahydrofuran (THF), methyl ethyl ketone (MEK), dimethyl formamide (DMF), dimethyl sulfoxide (DMSO), methylene chloride (MC), or the like, may be used, without limitation. These solvents may be used alone or as a mixture of two or more thereof. The use amount of the solvent may not be limited to being within a specific range, and an appropriate amount and/or concentration of the solvent may be used within a range sufficient for sufficiently dissolving the reacting material and not adversely affecting the reaction. A person skilled in the art may select an appropriate amount and/or concentration of the solvent in consideration of the above-mentioned points.

An exemplary reaction scheme of the above preparing method (1) of Formula I-1 when Z is IA is as follows.

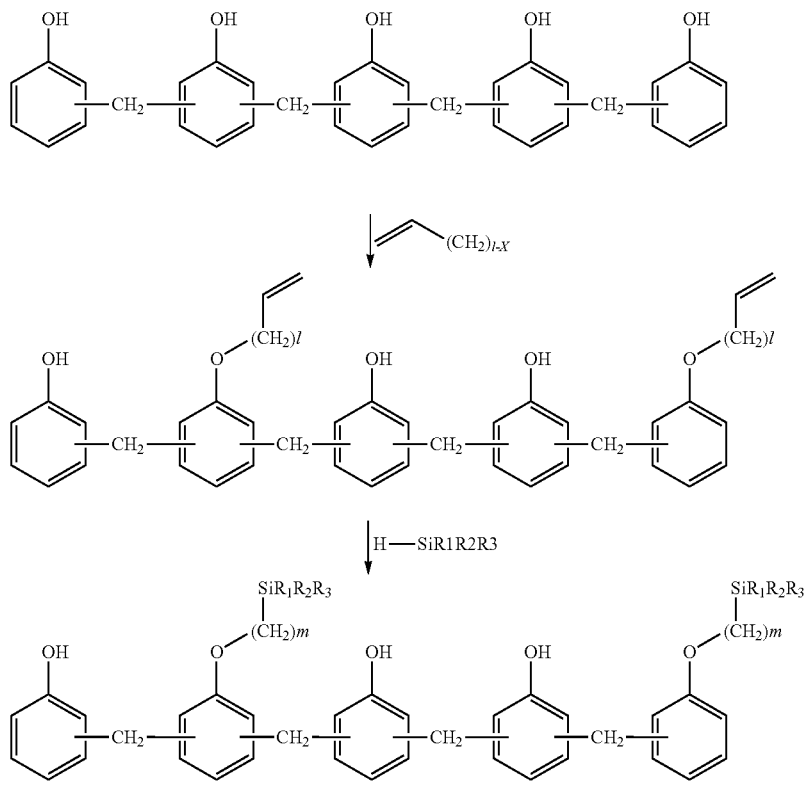

As defined in the novolac curing agent of Formulae I-1 to I-4, at least one of a plurality of substituents A of Formulae I-1 to I-4 may have a structure of Formula A2 (that is, an alkoxysilyl group), and the remainder thereof may be hydrogen.

The number of alkoxysilyl groups in Formulae I-1 to I-4, may be changed by controlling the number of hydroxyl groups alkenylated by controlling the equivalents of the alkenyl compound and the reaction temperature in the first step of the first reaction. A person skilled in the art may appropriately control the number of hydroxyl group in consideration of reactivity from the above-disclosed points.

(2) Preparing method of novolac curing agent with alkoxysilyl group of Formulae I-1 to I-4 modified with Formula A3 (Method 2)

According to another embodiment in the present disclosure, a preparing method of a novolac curing agent of Formulae I-1 to I-4 with a substituent of Formula A3 is provided. The novolac curing agent of Formulae I-1 to I-4 with the substituent of Formula A3 may be prepared by an alkoxysilylation step of alkoxysilylating a starting material.

In the alkoxysilylation step, the starting material of Formulae IA-1 to IA-4 to be alkoxysilylated to produce one of novolac curing agents of Formulae I-1 to I-4 with a substituent of Formula A3. Meanwhile, the alkoxysilylation step may be performed in the presence of an optional base and an optional solvent.

In the alkoxysilylation step, the reaction of the starting material IA and alkoxysilane with an isocyanate functional group of Formula IIIB may be performed at a temperature of from −20° C. to 120° C. for 1 hour to 72 hours so that 0.1 to 5 equivalents of the alkoxysilane with the isocyanate functional group of Formula IIIB with respect to 1 equivalent of a hydroxyl group of the starting material IA may react.

OCN—(CH$_2$)$_m$—SiR$_1$R$_2$R$_3$     [Formula IIIB]

In Formula IIIB, at least one of R$_1$ to R$_3$ is an alkoxy group of 1 to 5 carbon atoms, and preferably, an alkoxy group of 1 to 3 carbon atoms, and more preferably, a methoxy group or an ethoxy group. The methoxy group may be preferably used in consideration of high reactivity, and the ethoxy group may be preferably used in consideration of stability of an agent and excellent reactivity. The remainder thereof is an alkyl group of 1 to 10 carbon atoms, the alkoxy group and the alkyl group may be a linear or a branched, and m is an integer of 3 to 10, and preferably, an integer of 3 to 6.

In the alkoxysilylation step, the reaction of the starting material IA and alkoxysilane with an isocyanate functional group is performed according to the equivalent ratio of a hydroxyl group of the starting material IA and the alkoxysilane on the basis of stoichiometry. Thus, the reaction of the starting material IA and the alkoxysilane with an isocyanate functional group is performed so that 0.1 to 5 equivalents of alkoxysilane with respect to 1 equivalent of a hydroxyl group of the starting material IA may react in consideration of the equivalent ratio.

The reaction temperature and the reaction time of the alkoxysilylation step may be changed depending on the type of reacting material, and the reaction may be performed, for example, at a temperature of from −20° C. to 120° C. for 1 hour to 72 hours to produce one novolac curing agent of Formulae I-1 to I-4 with a substituent of —CONH(CH$_2$)$_n$—SiR$_1$R$_2$R$_3$.

The reaction of the alkoxysilylation step may be performed in the presence of a base as occasion demands. In the case in which a separate base is used, a rate of the reaction may be increased. The base used may include, for example, K$_2$CO$_3$, Na$_2$CO$_3$, KHCO$_3$, NaHCO$_3$, triethylamine, diisopropylethylamine, or the like, without limitation. These bases may be used alone or as a combination of two or more thereof. In the case of using the base, 0.1 to 5 equivalents of the base may be preferably used with respect to 1 equivalent of the hydroxyl group of the starting material IA in consideration of reaction efficiency.

The solvent during the reaction of the alkoxysilylation step may be any solvent as occasion demands. For example, the solvent may not be used in a case in which the viscosity of the reacting material at the reaction temperature is appropriate for carrying out the reaction without using a separate solvent in the alkoxysilylation step. That is, a separate solvent is not required in the case in which the viscosity of the reacting material is sufficiently low, and mixing and stirring of the reacting material may be easily performed without a solvent. This may be easily determined by a person skilled in the art. In the case in which the solvent is used, any aprotic solvents may be used, as an available solvent, if able to dissolve the reacting material properly, not inducing any adverse influence to the reaction, and being easily removed after the reaction. For example, toluene, acetonitrile, tetrahydrofuran (THF), methyl ethyl ketone (MEK), dimethyl formamide (DMF), dimethyl sulfoxide (DMSO), methylene chloride (MC), or the like, may be used without limitation. These solvents may be used alone or as a mixture of two or more thereof. An amount of the solvent may not be limited to being within a specific range, and an appropriate amount of the solvent may be used within a range sufficient for sufficiently dissolving the reacting material and not adversely affecting the reaction. A person skilled in the art may select an appropriate amount of the solvent in consideration of the above-mentioned points.

An exemplary reaction scheme of the above preparing method (2) of Formula I-1 when Z is IA is as follows.

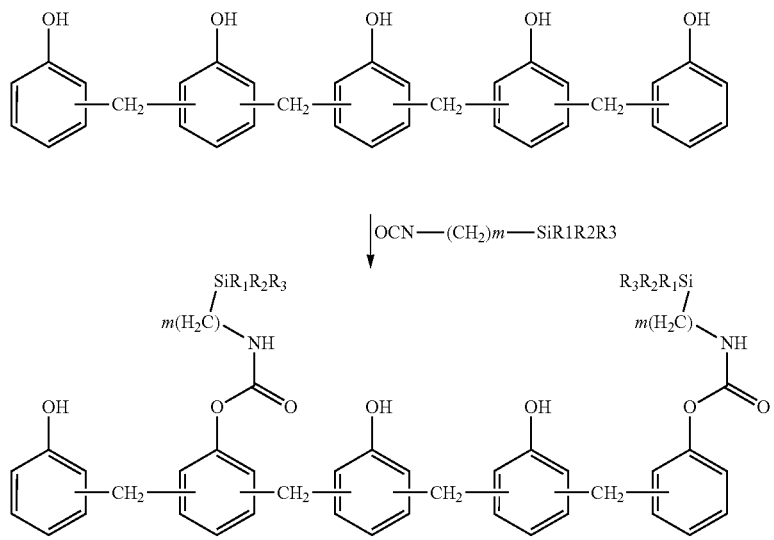

As defined in the novolac curing agent of Formulae I-1 to I-4, at least one of a plurality of substituents A of Formulae I-1 to I-4 may have a structure of Formula A3 (that is, alkoxysilyl group), and the remainder thereof may be hydrogen. The number of the alkoxysilyl groups in Formulae I-1 to I-4 may be changed by controlling the number of the hydroxyl groups to be epoxidated by controlling equivalents of the alkoxysilane and the reaction temperature in the alkoxysilylation step. A person skilled in the art may appropriately control the numbers of hydroxyl group in consideration of the reactivity from the above-disclosed points.

3. Composition Including Novel Novolac Curing Agent

According to another embodiment in the present disclosure, a composition including an epoxy resin and at least one novel novolac curing agent selected from the group consisting of Formulae I-1 to I-4, is provided.

Any composition provided in the present disclosure may be used in various applications such as, as an electronic material, for example, a semiconductor substrate such as an IC substrate or a build-up film, an encapsulating material (packaging material), an electronic part such as a printed circuit board, an adhesive, a paint composition, a composite material, or the like, without limitation. In addition, any composition provided in the present disclosure may be a curable composition including an inorganic material.

Any composition according to any embodiments described above and later in the present disclosure may include any type and/or any mixing ratio known in the related art if only including at least one novel novolac curing agent selected from the group consisting of Formulae I-1 to I-4 according to an embodiment in the present disclosure. In this case, the type and the mixing ratio of an epoxy resin, a curing agent according to an exemplary embodiment in the present disclosure and a curing agent in the related art (an existing curing agent), a curing accelerator (catalyst), an inorganic material (filler) (for example, inorganic particles and/or a fiber), and other additives included in the composition are not limited.

The epoxy resin may be any epoxy resins commonly known in the related art without limitation, and may be, for example, at least one selected from the group consisting of a glycidyl ether-based epoxy resin, a glycidyl-based epoxy resin, a glycidyl amine-based epoxy resin, and a glycidyl ester-based epoxy resin. Further, the epoxy resin may at least one selected from the group consisting of a glycidyl ether-based epoxy resin, a glycidyl-based epoxy resin, a glycidyl amine-based epoxy resin, and a glycidyl ester-based epoxy resin having bisphenol, biphenyl, naphthalene, benzene, thiodiphenol, fluorene, anthracene, isocyanurate, triphenylmethane, 1,1,2,2-tetraphenylethane, triphenylmethane, 4,4'-diaminodiphenylmethane, aminophenol alicyclic, aliphatic, or a novolac unit, as a core structure.

For example, the epoxy resin in the related art may at least one selected from the group consisting of a glycidyl ether-based epoxy resin, a glycidyl-based epoxy resin, a glycidyl amine-based epoxy resin, and a glycidyl ester-based epoxy resin having bisphenol, biphenyl, naphthalene, fluorene, benzene, thiodiphenol, fluorene, anthracene, isocyanurate, triphenylmethane, 1,1,2,2-tetraphenylethane, triphenylmethane, 4,4'-diaminodiphenylmethane, aminophenol, alicyclic, aliphatic, or a novolac unit, as a core structure.

Further, the epoxy resin in the related art may or may not have an alkoxysilyl group.

Any composition according to any embodiments described above and later in the present disclosure may include a novolac curing agent alkoxysilylated in the present disclosure, as a curing agent. Additionally, any curing agents in the related art (existing curing agents) commonly known as a curing agent with respect to an epoxy resin may be added, in addition to a novolac curing agent alkoxysilylated according to an exemplary embodiment in the present disclosure. For example, a novolac curing agent (novolac curing agent in the related art which does not have an alkoxysilyl group), an amine, an acid anhydride, or the like may be used, as the curing agent in the related art, without limitation.

More particularly, an aliphatic amine, an alicyclic amine, an aromatic amine, other amines and a modified polyamine may be used as an amine curing agent without limitation. In addition, an amine compound including two or more primary amine groups may be used. Particular examples of the amine curing agent may include at least one aromatic amine selected from the group consisting of 4,4'-dimethylaniline (diamino diphenyl methane, DAM or DDM), diamino diphenyl sulfone (DDS), and m-phenylene diamine, at least one aliphatic amine selected from the group consisting of diethylene triamine (DETA), diethylene tetramine, triethylene tetramine (TETA), m-xylene diamine (MXDA), methane diamine, (MDA), N,N'-diethylenediamine (N,N'-DEDA), tetraethylenepentaamine (TEPA), and hexamethylenediamine, at least one alicyclic amine selected from the group consisting of isophorone diamine (IPDI), N-aminoethyl piperazine (AEP), bis(4-amino 3-methylcyclohexyl)methane (larominc 260), other amines such as dicyanamide (DICY), or the like, and a modified amine such as a polyamide-based compound, an epoxide-based compound, or the like.

Examples of a phenol curing agent may include, without limitation, a phenol novolac resin, a cresol novolac resin, a bisphenol A novolac resin, a xylene novolac resin, a triphenyl novolac resin, a biphenyl novolac resin, a dicyclopentadiene novolac resin, a phenol p-xylene resin, a phenol 4,4'-dimethylbiphenylene resin, a naphthalene phenol novolac resin, or the like.

Examples of an acid anhydride-based curing agent may include, without limitation, an aliphatic acid anhydride such as dodecenyl succinic anhydride (DDSA), poly azelaic poly anhydride, or the like, an alicyclic acid anhydride such as hexahydrophthalic anhydride (HHPA), methyl tetrahydrophthalic anhydride (MeTHPA), methylnadic anhydride (MNA), or the like, an aromatic acid anhydride such as trimellitic anhydride (TMA), pyromellitic acid dianhydride (PMDA), benzophenonetetracarboxylic dianhydride (BTDA), or the like, and a halogen-based anhydrous compound such as tetrabromophthalic anhydride (TBPA), chlorendic anhydride, or the like.

In general, a degree of curing of an epoxy composite may be controlled by the reaction degree of the curing agent and the epoxy resin. According to a range of a target degree of curing, an amount of the curing agent may be controlled based on a concentration of the epoxy group of the epoxy resin. For example, when a curing agent according to an exemplary embodiment in the present disclosure is used alone or as a mixture with a curing agent in the related art, a ratio of an epoxy equivalent/curing agent equivalent may be preferably controlled to be 0.5 to 2.0, for example, 0.8 to 1.5 in an equivalent reaction of the curing agent and the epoxy group.

Any curing agents for curing an epoxy resin not separately described in this application but used for curing an epoxy resin may be used by appropriately mixing a stoichiometric amount of the epoxy functional group and the reactive functional group of the curing agent based on a concentration of the total epoxy group in the composition according to the desired range of the degree of curing. The above-described elements are commonly known in this field.

Further, according to an embodiment in the present disclosure, a composition including a novel novolac curing agent according to any embodiments described above or later of the present disclosure may further include an inorganic material (filler), for example, inorganic particles and/or a fiber as occasion demands, and a composition including an inorganic material is referred to as "composite composition" for convenience. The composite composition may include any type and/or any mixing ratio known in the related art only if including an epoxy resin, at least one novel novolac curing agent selected from the group consisting of Formulae I-1 to I-4, and a filler. The type and a mixing ratio of an epoxy resin, a curing agent according to an exemplary embodiment in the present disclosure, a curing agent in the related art (an existing curing agent), a curing accelerator (catalyst), an inorganic material (filler) (for example, inorganic particles and/or a fiber), and other additives included in the composition are not limited.

Any inorganic particles known to be used to reinforce physical properties of a thermosetting resin in the related art may be used. Examples of the inorganic particles may include, without limitation, at least one selected from the group consisting of at least one metal oxide selected from the group consisting of silica (including, for example, fused silica and crystalline silica), zirconia, titania, alumina, silicon nitride, and aluminum nitride, and silsesquioxane. The inorganic particles may be used alone, or as a mixture of two or more thereof.

In the case in which particularly a large amount of silica is mixed, the fused silica is preferably used. The fused silica may have either of a cataclastic shape or a spherical shape. However, the spherical shape is preferably used to increase a mixing ratio of the fused silica and to suppress the fused viscosity of a forming material from being increased.

The inorganic particles with a particle size of 0.5 nm to several tens of μm (for example, from 50 μm to 100 μm) may be used, without limitation, in consideration of a use of a composite, particularly, dispersibility of the inorganic particles, and the like. Since the inorganic particles are dispersed in the epoxy resin and the dispersibility thereof is different according to a particle size, inorganic particles with the above-described different sizes may be preferably used in combination. In addition, a distribution range of particle size of the inorganic particles to be mixed is preferably increased to increase an amount of mixing the inorganic particles.

In the composition including a novel novolac curing agent and an epoxy resin according to an embodiment in the present disclosure, an amount of adding the inorganic particles with respect to the epoxy resin may be appropriately controlled according to a decrease of a CTE of epoxy composite, appropriate viscosity required in a application of the composition, and usage thereof. For example, an amount of the inorganic particles may be 5 wt % to 95 wt %, for example, 5 wt % to 90 wt %, for example 10 wt % to 90 wt %, for example, 30 wt % to 95 wt %, for example, 30 wt % to 90 wt %, for example, 5 wt % to 60 wt %, for example, 10 wt % to 50 wt % based on the total weight of a solids content of the composition, meanwhile, in the case of an epoxy cured article based on the total weight of the epoxy cured article.

More particularly, in an exemplary embodiment, in a case in which the composition according to an exemplary embodiment in the present disclosure is used as a semiconductor encapsulating material, or the like, an amount of the inorganic particles may be, for example, 30 wt % to 95 wt %, for example, 30 wt % to 90 wt %, without limitation, in consideration of a CTE value and material processability, based on the total weight of a solids content of the composition, meanwhile, in a case of an epoxy cured article based on the total weight of the epoxy cured article. In an exemplary embodiment, in a case in which the composition is used as a semiconductor substrate, or the like, an amount of the inorganic particles may be, for example, 5 wt % to 60 wt %, for example, 10 wt % to 50 wt %, in consideration of a CTE value and strength and the like of a substrate, based on the total weight of a solids content of the composition, meanwhile, in a case of an epoxy cured article based on the total weight of the epoxy cured article.

Meanwhile, in a case in which a fiber is used as an inorganic material, any type of fiber and dimensions thereof commonly used in the art, may be used.

Any commonly used fibers used for the improvement of physical properties of a thermosetting resin cured article in the related art may be used without limitation. Particularly, a glass fiber, an organic fiber, or a mixture thereof may be used. In addition, the term 'glass fiber' used in this application may include a woven glass fiber fabric, a non-woven glass fiber fabric, or the like as well as a glass fiber. Examples of the glass fiber may be, without limitation, an E-glass fiber, a T-glass fiber, an S-glass fiber, an NE-glass fiber, a D-glass fiber, a quartz glass fiber, or the like. For example, an E or T glass fiber may be included therein. An organic fiber may be, without limitation, one selected from the group consisting of a liquid crystal polyester fiber, a polyethyleneterephthalate fiber, a wholly aromatic fiber, a polybenzoxazole fiber, a nylon fiber, a polyethylene naphthalate fiber, a polypropylene fiber, a polyether sulfone fiber, a polyvinylidene fluoride fiber, a polyethylene sulfide fiber, a polyether ether ketone fiber. These fibers may be used alone or as a combination of two or more thereof.

In the composition including any novel novolac curing agents according to an exemplary embodiment in the present disclosure, for example, in a glass fiber composite composition, an amount of a fiber may be 10 wt % to 90 wt %, for example, 30 wt % to 70 wt %, in addition, for example, 35 wt % to 65 wt % based on the total weight of a solids content of the composition. In addition, in a cured article of the composition, for example, in a glass fiber composite, an amount of a fiber may be 10 wt % to 90 wt %, for example, 30 wt % to 70 wt %, in addition, for example, 35 wt % to 65 wt % based on the total weight of the cured article. Thus, a content of a resin may be 10 wt % to 90 wt %, for example, 30 wt % to 70 wt %, in addition, for example, 35 wt % to 65 wt %. An amount of the fiber may be preferably within the above-described range in consideration of an increase in thermal resistance and a processability aspect. Meanwhile, in a composition, a cured article, or the like including a fiber, a solids content part excluding the fiber from the total solids content is commonly referred to as a resin. In the composition including the fiber, an amount other than the fiber is a content of the resin.

Further, in any compositions including the fiber according to an exemplary embodiment in the present disclosure, inorganic particles may be additionally included as occasion demands. In this case, the inorganic particles may be mixed with the composition in an amount of 1 wt % to 70 wt % based on the weight of a resin content in consideration of improvement of physical properties and processability. In this case, the type of the inorganic particles which may be used, is not specifically limited, and any inorganic particles known in the art may be used. For example, the type of the above-described inorganic particles may be used.

According to another embodiment in the present disclosure, the composition according to any embodiments described above and layer of the present disclosure, may additionally include an alkoxysilyl group reaction catalyst (hereinafter, "reaction catalyst") as occasion demands, and the composition including the alkoxysilyl group reaction catalyst is referred to as "reaction catalyst-containing composition" for convenience. In addition, the reaction catalyst-containing composition may include at least one novel novolac curing agent selected from the group consisting of Formulae I-1 to I-4, and the reaction catalyst. However, the type and a mixing ratio of an epoxy resin, a curing agent of the present disclosure, a curing agent in the related art, a curing accelerator (catalyst), an inorganic material (filler) (for example, inorganic particles and/or a fiber), and other additives included in the composition are not limited. The alkoxysilyl group reaction catalyst may be included therein for more improved processability (for example, a rapid curing rate and/or a low curing temperature).

When the alkoxysilyl group reaction catalyst is included in the composition according to any embodiments of the present disclosure, the alkoxysilyl group reaction catalyst may be, without limitation, at least one selected from the group consisting of at least one inorganic acid selected from the group consisting of, for example, nitric acid, sulfuric acid, hydrochloric acid, acetic acid, and phosphoric acid; ammonia; KOH; NH$_4$OH; amine; and a transition metal alkoxide, a metal oxide, a metal organic acid salt, and a metal halide (for example, a tin compound such as dibutyltin dilaurate, a tin salt of octylic acid, tin(II) 2-ethylhexanoate, or the like). These compounds may be used alone or as a mixture of two or more thereof. The mixing ratio of the alkoxysilyl group reaction catalyst is not specifically limited, but 0.01 phr to 10 phr of the alkoxysilyl group reaction catalyst may be used with respect to the epoxy resin in consideration of reactivity.

In the composition including the alkoxysilyl group reaction catalyst, water may be additionally included to improve efficiency of the alkoxysilyl group reaction catalyst. In this case, an amount of mixing ratio of water is not specifically limited, but 0.01 to 20 equivalents of water may be included with respect to 1 equivalent of the alkoxysilyl group in consideration of efficiency and reactivity as the catalyst.

An optional curing accelerator (curing catalyst) may be additionally included as occasion demands to promote a curing reaction, in the composition including any novel novolac curing agents provided in the present disclosure. In addition, in a case of the novolac curing agent, a curing accelerator commonly used, is used to improve reactivity with an epoxy resin. In view of technical common knowledge in the related art, it is apparent to those skilled in the art that any compositions described above and later, may include a curing accelerator according to a degree of a curing reaction.

Any catalysts known to be commonly used for curing the composition in the art, may be used as a curing accelerator (curing catalyst). The curing accelerator, without limitation, for example, an imidazole, a tertiary amine, quaternary ammonium, an organic acid salt, a Lewis acid, a phosphor compound, or the like may be used.

More particularly, for example, an imidazole-based curing accelerator such as 2-methylimidazole (2MZ), 2-undecylimidazole, 2-ethyl-4-methylimidazole (2E4M), 2-phenylimidazole, 1-(2-cyanoethyl)-2-alkyl imidazole, 2-heptadecylimidazole (2HDI), or the like; a tertiary amine compound such as benzyl dimethyl amine (BDMA), tris dimethylaminomethyl phenol (DMP-30), diazacycloundecene (DBU), triethylenediamine, or the like; a quaternary ammonium salt such as tetrabutylammonium bromide, or the like; a diazabicycloundecene (DBU) or an organic acid salt of DBU; a phosphor-based compound such as triphenyl phosphine, phosphoric acid ester, or the like, and a Lewis acid such as BF$_3$-monoethylamine (BF$_3$-MEA), or the like, may be used without limitation. These curing accelerators latent due to microcapsule coating thereof, complex salt formation, or the like, may be used. These compounds may be used alone or as a mixture of two or more thereof according to curing conditions.

An amount of mixing the curing accelerator may be used in a mixing amount commonly used in the art without limitation. For example, the amount of mixing the curing accelerator may be 0.1 phr to 10 phr (parts per hundred resin, parts by weight based on 100 parts by weight of an epoxy resin), for example, 0.2 phr to 5 phr based on the epoxy resin. The above-described amount of the curing accelerator may be preferably used in consideration of a curing reaction accelerating effect and curing reaction rate controlling aspect. Through using the above-described range of the amount of mixing the curing accelerator, curing may be rapidly carried out, and improvement of throughput may be expected.

In the composition, other additives such as a releasing agent, a surface treating agent, a flame retardant, a plasticizer, bactericides, a leveling agent, a defoaming agent, a colorant, a stabilizer, a coupling agent, a viscosity controlling agent, a diluent, a rubber, a thermoplastic resin, or the like may be mixed to commonly control physical properties of the composition within a range of not damaging physical properties of the composition as occasion demands.

For example, when a thin film is formed using any compositions according to an exemplary embodiment in the present disclosure, a composition possessing the insufficient flexibility may be brittle, whereby a crack may be generated. This phenomenon may be exhibited when, for example, any compositions according to an exemplary embodiment in the present disclosure include a large amount of inorganic particles. Thus, to improve availability in the composition, a rubber and/or a thermoplastic resin may be added to the composition including any novel novolac curing agents according to an exemplary embodiment in the present disclosure. As the thermoplastic resin and a rubber-modified epoxy resin, a resin commonly known in the art, may be used. As a rubber, any rubber known in the art may be used only when the rubber is not dissolved by a solvent used in the composition and maintains a dispersed state in the composition. The type of the rubber may include, for example, an acrylonitrile butadiene rubber, a butadiene rubber, an acryl rubber, core-shell type rubber particles, cross-linked acrylonitrile butadiene rubber particles, cross-linked styrene butadiene rubber particles, acryl rubber particles, and the like, without limitation. These materials may be used alone or a combination of two or more thereof may be used at the same time. In a case of using a rubber particle, an average particle diameter may preferably be from 0.005 µm to 1 µm, and more preferably from 0.2 µm to 0.6 µm in consideration of improvement of physical properties. The rubber particles may be mixed in, for example, an amount of 0.5 wt % to 10 wt % thereof in consideration of physical properties based on weight of a solids content of the composition according to an exemplary embodiment in the present disclosure.

As a thermoplastic resin, a phenoxy resin, a polyvinyl acetal resin, a polyimide resin, a polyamideimide resin, a polyether sulfone resin, a polysulfone resin, or the like may be used without limitation. These materials may used alone or two or more thereof may be used at the same time. The thermoplastic resin may be mixed in, for example, 0.5 wt % to 60 wt %, and preferably, 3 wt % to 50 wt % based on weight of a solids content of the composition according to an exemplary embodiment in the present disclosure in consideration of physical properties.

As described above, the term "composition, composition or composition including novel novolac curing agent according to an exemplary embodiment in the present disclosure" used in the present application will be understood to include an epoxy resin and a novolac curing agent according to an exemplary embodiment in the present disclosure, and other constituents composing the composition as occasion demands, for example, a curing agent in the related art, an optional curing accelerator (catalyst), an inorganic material (filler), for example, inorganic particles and/or a fiber, and other additives mixed as occasion demands in the art other than a solvent. Thus, generally, in the composition, the solvent may be optionally used to suitably control an amount of a solids content of the composition and/or viscosity thereof in consideration of processability and the like of the composition. Meanwhile, the term "total weight of solids content of composition" used in the present disclosure refers to total weight of a component except for the solvent in components composing the above described composition.

Any compositions according to an exemplary embodiment in the present disclosure provided in any embodiments of the present disclosure, may be used as a composition for an electronic material. The electronic material may include, without limitation, for example, a substrate for a semiconductor build-up film, a prepreg, a laminated plate in which a metal film is disposed on a base formed using the composition according to an exemplary embodiment in the present disclosure, an encapsulating material (packaging material), an electronic component such as a printed circuit board, or the like. In addition, the composition may be used in various applications such as an adhesive, a paint, a composite material, and the like. According to another embodiment in the present disclosure, an electronic material including or formed using any compositions including the novolac curing agent according to an exemplary embodiment in the present disclosure, is provided. Further, a semiconductor device including, or essentially formed using, or formed using the electronic material, is provided. Particularly, the semiconductor device may be a semiconductor device including a printed circuit board (for example, a printed circuit board on which a semiconductor element is mounted) and/or a semiconductor device including a semiconductor packaging material including, or essentially formed using, or formed using the composition including the novolac curing agent according to an exemplary embodiment in the present disclosure. In addition, a cured article, an adhesive, a paint, or a composite material including, or essentially formed using, or formed using any compositions provided in any embodiments of the present disclosure, may be provided.

According to another embodiment in the present disclosure, a cured article including, or essentially formed using, or formed using the composition according to an exemplary embodiment in the present disclosure, provided in any embodiments of the present disclosure, may be provided. In a case in which the composition provided in any embodiments of the present disclosure, is practically used, for example, when the composition is practically used as an electronic material or the like, the composition is used as a cured article. In the art, the cured article formed of the composition including the epoxy resin and the filler which is an inorganic component, may be commonly referred to as a composite.

The novel novolac curing agent provided in any above-described embodiments of the present disclosure may have excellent thermal resistance properties and excellent flame retardant when used in the preparation of the composite.

Particularly, the composite may exhibit a low CTE, for example, 15 ppm/° C. or less, for example, 12 ppm/° C. or less, for example, 10 ppm/° C. or less, for example, 8 ppm/° C. or less, for example, 6 ppm/° C. or less, for example, 4 ppm/° C. or less. Physical properties of the composite are improved as a CTE value is reduced, whereby a lower limit value of a CTE is not particularly limited.

For example, a composite including the novel novolac curing agent according to an exemplary embodiment in the present disclosure as a curing agent, a glass fiber, for example, an E-glass and/or a T-glass glass fiber as an inorganic material with a resin content of 30 wt % to 60 wt % (the resin content may include or may not include inorganic particles), may exhibit a CTE of, for example, 10 ppm/° C. or less, for example, 8 ppm/° C. or less, for example, 6 ppm/° C. or less, for example, 4 ppm/° C. or less.

In addition, for example, a composite including any novel novolac curing agents according to an exemplary embodiment in the present disclosure as a curing agent, and inorganic particles as an inorganic material, for example, 60 to 80 wt %, for example, 70 to 80 wt % of silica particles, may exhibit a CTE of 20 ppm/° C. or less, for example, 15 ppm/° C. or less, for example, 10 ppm/° C. or less, for example, 8 ppm/° C. or less, for example, 6 ppm/° C. or less, for example, 4 ppm/° C. or less.

In addition, Tg of the composite (cured article including an inorganic material) according to an exemplary embodiment in the present disclosure, may be higher than 100° C., for example, 130° C. or over, in addition, for example, 250° C. or over. Otherwise, the composite may be Tg-less. Physical properties of the composite are improved as a Tg value is higher, whereby an upper limit value of Tg is not particularly limited.

In the present application, the values delimited by the range include the lower limit value, the upper limit value, any sub ranges in the range, and all numerals included in the range, unless otherwise specifically stated. For example, C1 to C10 will be understood to include all of C1, C2, C3, C4, C5, C6, C7, C8, C9, and C10. In addition, in a case in which the lower limit value or the upper limit value of the numerical range is not defined, it would be understood that a smaller or larger value may provide the better properties. In addition, it would be understood that the limit is not defined and any values may be included. For example, a CTE of 4 ppm/° C. or less will be understood to include all values in the range such as the CTE of 4, 3.5, 3, 2.7, 2, 1.4, 1, 0.5 ppm/° C., and the like.

Hereinafter, the present disclosure will be explained in detail through examples. The following examples are for illustrating the present disclosure and not for limiting the present disclosure.

Synthetic Example 1: Synthesis of a Silylated Phenol Novolac Curing Agent

In a flask, 15 g of a phenol novolac curing agent (Structural formula 1, Meiwa Plastic Ind. Co., trade name HF-1M), 8.67 g of triethoxysilyl propylisocyanate, and 150 ml of tetrahydrofuran (THF) were added thereto and mixed, followed by stirring at room temperature for 15 hours under argon gas. After a reaction, a solvent was removed using an evaporator, a silyated novolac curing agent with a concentration ratio of a hydroxyl group and a silyl functional group of a novolac curing agent, in other words, a ratio of [OH]:[Si]=3.9:1, was obtained. NMR data of the obtained final product are as follows.

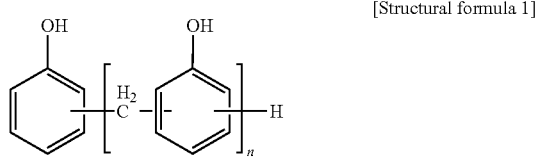

[Structural formula 1]

$^1$H NMR (400 MHz, DMSO): δ=9.43-8.93 (m, 3.89H), 7.71 (s, 0.97H), 7.26-6.51, (m, 20.71H), 3.94-3.55 (m, 16.33H), 3.15-2.89 (m, 2.57H), 1.62-1.44 (m, 2.61H), 1.19-1.04 (m, 11.98H), 0.66-0.43 (m, 2.46H)

Synthetic Example 2: Synthesis of a Silylated Phenol Novolac Curing Agent

The same procedure was performed as described in Synthetic Example 1 except for using 11.44 g of triethoxysilyl propylisocyanate to produce a silylated phenol novolac curing agent with a concentration ratio of a hydroxyl group and a silyl functional group of a novolac curing agent, in other words, a ratio of [OH]:[Si]=2.6:1.

$^1$H NMR (400 MHz, DMSO): δ=9.43-8.93 (m, 3.11H), 7.71 (s, 1.47H), 7.26-6.51 (m, 20.21H), 3.94-3.55 (m, 18.55H), 3.15-2.89 (m, 3.57H), 1.62-1.44 (m, 3.48H), 1.19-1.04 (m, 15.09H), 0.66-0.43 (m, 3.63H)

Synthetic Example 3: Synthesis of a Silylated Phenol Novolac Curing Agent (1) First Step:

In a flask, 10 g of a phenol novolac curing agent (Structural formula 1, Meiwa Plastic Ind. Co., trade name HF-1M), 3.74 g of NaOH, and 250 ml of DMSO were added thereto and stirred at room temperature for 30 minutes. Then, a temperature thereof was lowered to 0° C., 2.26 g of allyl bromide was added thereto, followed by stirring at room temperature for 2 hours. After a reaction, a reaction mixture was worked-up by using 400 ml of ethyl acetate and a saturated NaCl solution. An organic layer was separated and MgSO$_4$ was added to the organic layer, thereby removing remaining H$_2$O. The reaction mixture was filtered using a celite filter, and a solvent was removed by using an evaporator to produce an allylated novolac curing agent with a concentration ratio of a hydroxyl group and an allyl functional group, in other words, a ratio of [OH]:[allyl group]=4:1. NMR data of an obtained final product are as follows.

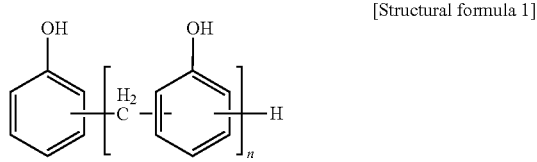

[Structural formula 1]

$^1$H NMR (400 MHz, DMSO): δ=7.14-6.70 (m, 21.68H), 6.04-6.00 (m, 1.35H), 5.41-5.20 (m, 2.98H), 4.49-4.47 (m, 3.01H), 4.17-3.80 (m, 11.8H)

(2) Second Step:

In a flask, 10 g of an allylated novolac curing agent obtained in the first step, 2.85 g of triethoxysilane, 79 mg of a platinum oxide, and 100 ml of toluene were added thereto and mixed, followed by stirring at 85° C. for 24 hours while the flask was filled with argon. After a reaction, the obtained crude product was celite-filtered, and a solvent was removed by using an evaporator to produce a silylated phenol novolac curing agent with a concentration ratio of a hydroxyl group and a silyl functional group of a novolac curing agent, in other words, a ratio of [OH]:[Si]=1:1. NMR data of the obtained final product are as follows.

$^1$H NMR (400 MHz, DMSO): δ=9.31 (br.s, 4.92H), 7.14-6.70 (m, 21.68H), 4.17-3.80 (m, 25.23H), 1.82-1.70 (m, 2.78H), 1.24-1.20 (m, 12.99H), 0.80-0.61 (m, 2.60H)

Synthetic Example 4: Synthesis of a Silylated Novolac Curing Agent (Phenol Aralkyl Resin)

In a flask, 15 g of a novolac curing agent (Mitsui Chemicals Inc. Co., trade name XLC-4L) with structural formula 2, 7.31 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=2:1. NMR data of the obtained final product are as follows.

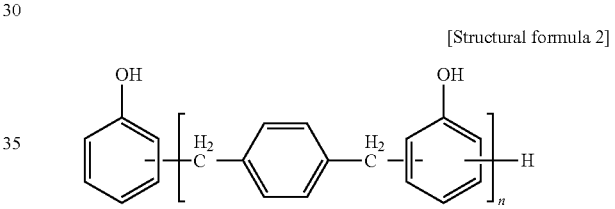

[Structural formula 2]

$^1$H NMR (400 MHz, DMSO): δ=9.31 (br.s, 3.66H), 7.75 (br.s, 1.98H), 7.08-6.68 (m, 19.91H), 4.20-3.79 (m, 12.84H), 3.32-3.12 (m, 4.73H), 1.72-1.54 (m, 4.27), 1.24-1.20 (m, 18.72H), 0.80-0.61 (m, 4.17H).

Synthetic Example 5: Synthesis of a Silylated Novolac Curing Agent (Biphenyl Aralkyl Type Phenol Resin)

In a flask, 15 g of a biphenyl novolac curing agent (Structural formula 3, Meiwa Plastic Ind. Co., trade name MEH-7851SS), 4.57 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=3:1. NMR data of the obtained final product are as follows.

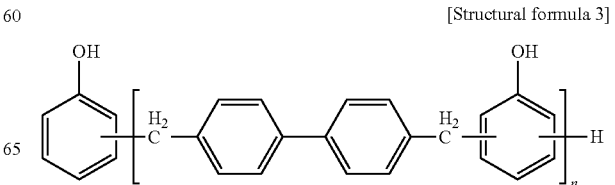

[Structural formula 3]

$^1$H NMR (400 MHz, DMSO): δ=9.41 (s, 0.78H), 9.26 (s, 0.29H), 9.21 (s, 0.59H), 7.88-6.61 (m, 20.40H), 4.05-3.70 (m, 8.27H), 3.15-2.85 (m, 1.15H), 1.69-1.45 (m, 1.12H), 1.28-1.05 (m, 5.86H), 0.67-0.42 (m, 1.16H),

Synthetic Example 6: Synthesis of a Silylated Dicyclopentadiene Novolac Curing Agent In a flask, 15 g of a dicyclopentadiene novolac curing agent (Structural formula 4, Nippon petrochemicals Co., trade name DCPDP), 3.53 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=4:1. NMR data of the obtained final product are as follows.

[Structural formula 4]

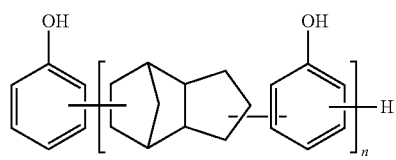

$^1$H NMR (400 MHz, DMSO): δ=9.30 (br. s, 3.11H), 7.80 (br.s, 0.76H), 7.39-6.59 (m, 23.00H), 3.79-3.51 (m, 7.88H), 3.10-2.61 (m, 8.18H), 2.25-1.00 (m, 50.26H), 0.65-0.51 (m, 1.61H)

Synthetic Example 7: Synthesis of a Silylated Novolac Curing Agent (Multifunctional Phenolresin)

In a flask, 15 g of a multifunctional novolac curing agent (Structural formula 5, Meiwa Plastic Ind. Co., trade name MEH-7500-35), 7.22 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=4:1. NMR data of the obtained final product are as follows.

[Structural formula 5]

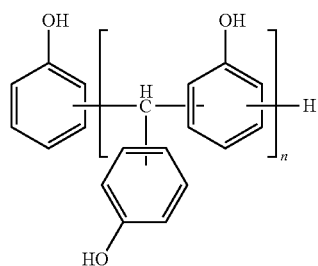

$^1$H NMR (400 MHz, DMSO): δ=9.19 (br.s, 6.29H), 7.05-6.51 (m, 26.00H), 5.91 (s, 0.57H), 5.58 (m, 0.74H), 3.87-3.45 (m, 12.75H), 3.15-2.91 (m, 3.72H), 1.54-1.48 (m, 3.90H), 1.20-1.16 (m, 18.45H), 0.67-0.50 (m, 3.33H)

Synthetic Example 8: Synthesis of a Silylated Cresolnovolac Curing Agent

In a flask, 15 g of a cresol novolac curing agent (Structural formula 6, DIC Corporation. Co., trade name KA-1163), 6.29 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=4:1. NMR data of the obtained final product are as follows.

[Structural formula 6]

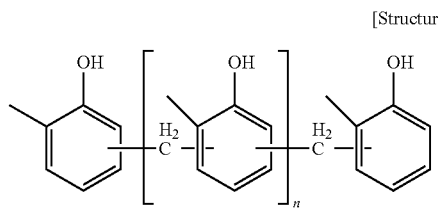

$^1$H NMR (400 MHz, DMSO): δ=9.32 (br.s, 2.99H), 7.77 (br.s, 0.77H), 7.02-6.89 (m, 10H), 4.24-3.36 (m, 12.25H), 3.18-3.01 (m, 1.89H), 2.24-2.10 (m, 12.88H), 1.73-1.40 (m, 1.88H), 1.20-1.14 (m, 9.99H), 0.64-0.50 (m, 1.60H)

Synthetic Example 9: Synthesis of a Silylated Bisphenol A Novolac-Based Curing Agent In a flask, 15 g of a bisphenol A novolac-based curing agent (Structural formula 7, DIC Corporation. Co., trade name VH-4150), 6.29 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=4:1. NMR data of the obtained final product are as follows.

[Structural formula 7]

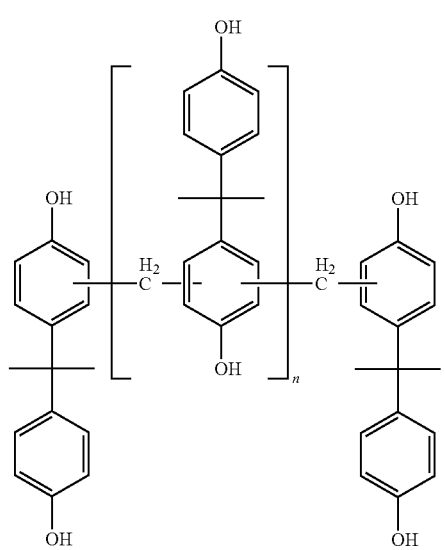

$^1$H NMR (400 MHz, DMSO): δ=9.31 (br. s, 7.65H), 7.76 (br. s, 1.76H), 7.20-7.05 (m, 16.00H), 6.89-6.75 (m, 17.58H), 4.22-3.79 (m, 37.28H), 3.36-3.28 (m, 4.23H), 1.62-1.20 (m, 62.11H), 0.67-0.51 (m, 3.95H)

Synthetic Example 10: Synthesis of a Silylated Naphthalene Novolac Curing Agent

In a flask, 15 g of a naphthalene novolac curing agent (Structural formula 8, Nippon Kayaku Co., trade name KAYAHARD CBN), 5.38 g of triethoxysilyl propylisocyanate, and 150 ml of tetrahydrofuran (THF) were added thereto and mixed, followed by stirring for 15 hours at room temperature under argon gas. After a reaction, a solvent was removed by using an evaporator to produce a silylated novolac curing agent with a concentration ratio of a hydroxyl group and a silyl functional group of a novolac curing agent, in other words, a ratio of [OH]:[Si]=4:1. NMR data of the obtained final product are as follows.

[Structural formula 8]

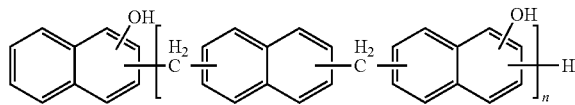

$^1$H NMR (400 MHz, DMSO): δ=9.30 (br.s, 3.51H), 7.75 (br.s 0.72H), 8.03-7.51 (m, 11.99H), 7.39-6.85 (m, 15.43H), 4.40-3.60 (m, 23.77H), 3.35-3.25 (m, 2.30H), 1.69-1.38 (m, 2.21H), 1.21-1.05 (m, 11.88H), 0.68-0.45 (m, 1.92H)

Evaluation of Physical Properties: Manufacturing of Cured Article and Evaluation of Thermal Resistance Properties 1. Manufacturing of Epoxy Composite
(1) Manufacturing of Epoxy Glass Fiber Composite (Cured Article)

An epoxy compound and silica slurry (solids content 70 wt %, a methylethylketone solvent, silica average size 1 μm) were dissolved in N,N-dimethylacetamide according to a component ratio in Table 1 so that a solids content was 40 wt %. After the mixed solution was mixed at a rate of 1500 rpm for 1 hour, a curing agent was added to the mixed solution and additionally mixed for 50 minutes. Then, here, a curing catalyst was added thereto and further mixed for 10 minutes to produce a binder solution including a silyl curing agent. In the binder solution, a glass fiber (Nittobo Co., T-glass) was impregnated to manufacture an epoxy glass fiber composite including a silylated curing agent. Then, the composite was placed into a vacuum oven heated to 100° C. and a solvent was removed, followed by curing in a hot press preheated to 120° C., at 120° C. for 2 hours, at 180° C. for 2 hours, and at a temperature of from 200° C. to 230° C. for 2 hours, thereby obtaining a glass fiber composite (4 mm×16 mm×0.1 mm).

(2) Manufacturing of Epoxy Filler Composite (Cured Article)

An epoxy compound, silica slurry (dispersion solution: methylethylketone solvent, silica average size 1 μm), and polyvinyl acetal were dissolved in N,N-dimethylacetamide according to a component ratio of Table 2, so that a solids content was 40 wt %. The mixed solution was mixed at a rate of 1500 rpm for 1 hour and 30 minutes, and a curing agent was added to the mixed solution, followed by additionally mixing for 30 minutes. The mixture was placed into a vacuum oven heated to 100° C. to remove a solvent, and cured in a hot press preheated to 120° C., at 120° C. for 2 hours, at 180° C. for 2 hours, and at a temperature of from 200° C. to 230° C. for 2 hours to obtain an epoxy filler (inorganic particles) composite (5 mm×5 mm×3 mm).

2. Evaluation of Thermal Resistant Physical Properties

To evaluate thermal resistance properties of a composite manufactured by the above-described method, a dimensional change with the temperature was measured by using a thermo-mechanical analyzer, and is shown in Tables 1 and 2. In addition, results obtained in Example 1 and Comparative Example 1 (Table 1) are shown in FIG. 1. In this case, a specimen of a glass fiber composite film was manufactured with the dimension of 4×16×0.1 (mm$^3$), and a specimen of a filler composite was manufactured with the dimension of 5×5×3 (mm$^3$).

As illustrated in Table 1, Table 2, and FIG. 1, the cured article obtained according to an exemplary embodiment in the present disclosure, was confirmed not to exhibit a glass transition temperature (Tg-less).

In Tables 1 and 2, in a case of a composite with a glass transition temperature, a CTE value before a glass transition temperature (T<Tg) is different from a CTE value after a glass transition temperature (T>Tg), these CTE values are denoted by $α_1$ and $α_2$, respectively. Thus, $α_1$ (T<Tg) denotes a CTE value in a temperature range before a glass transition temperature. Meanwhile, a CTE of a composite specimen commonly uses $α_1$ value, whereby $α_1$ (T<Tg) values are shown in Tables 1 and 2.

TABLE 1

| | | | Glass fiber composite | | | | | | |
|---|---|---|---|---|---|---|---|---|---|
| | | Epoxy compound (Synthetic Example No.) | Ex. 1 | Ex. 2 | Ex. 3 | Ex. 4 | Ex. 5 | Ex. 6 | Comparative Ex. 1 |
| Component (g) | Epoxy | DGEBA[1] | | | | | | | 5.00 |
| | | EXA4700[2] | 5.00 | 5.00 | 5.00 | | 5.00 | 5.00 | |
| | | YX4000H[3] | | | | 5.00 | | | |
| | | polydis[4] | | | | | | | |
| | Curing agent | Synthetic example 1 | 7.37 | | | | | | |
| | | Synthetic example 2 | | 9.04 | | | | | |
| | | Synthetic example 3 | | | 7.26 | | | | |
| | | Synthetic example 4 | | | | 11.72 | | | |

TABLE 1-continued

| | | Epoxy compound (Synthetic Example No.) | Ex. 1 | Ex. 2 | Ex. 3 | Ex. 4 | Ex. 5 | Ex. 6 | Comparative Ex. 1 |
|---|---|---|---|---|---|---|---|---|---|
| | | Synthetic example 5 | | | | | | 12.89 | |
| | | Synthetic example 8 | | | | | | 7.78 | |
| | | HF-1M[5] | | | | | | | 2.84 |
| | | TPP[6] | | | | | | | |
| | | 2E4MZ[7] | 0.05 | 0.05 | 0.05 | 0.05 | 0.05 | 0.05 | 0.04 |
| | | Polyvinyl acetal | 0.56 | 0.56 | 0.56 | 0.56 | 0.56 | 0.56 | 0.56 |
| | | Silica | 24.11 | 27.21 | 23.90 | 32.18 | 34.36 | 24.86 | 15.67 |
| | | Type of Glass fiber | T | T | T | T | T | T | T |
| | | Resin content (wt %) | 49% | 46% | 50% | 50% | 49% | 51% | 49% |
| Thermal resistance properties | CTE (ppm/°C.) | $\alpha_1$ (T < Tg) | 4.2 | 3.5 | 4.1 | 3.3 | 3.7 | 4.2 | 5.9 |
| | | Tg (°C.) | Tg-Less | Tg-Less | Tg-Less | Tg-Less | Tg-Less | Tg-Less | 180 |

TABLE 2

| | | Epoxy Compound (Synthetic Example No.) | Example 7 | Example 8 | Example 9 | Example 10 | Example 11 | Example 12 | Comparative Example 2 |
|---|---|---|---|---|---|---|---|---|---|
| Component (g) | Epoxy | DGEBA[1] | | | 3.00 | | | | |
| | | EXA4700[2] | 3.00 | 3.00 | | 3.00 | 3.00 | 3.00 | |
| | | YX4000H[3] | | | | | | | 3.00 |
| | | polydis[4] | 0.43 | 0.43 | 0.43 | 0.43 | 0.43 | 0.43 | 0.43 |
| | Curing agent | Synthetic example 1 | 3.97 | | | | | | |
| | | Synthetic example 2 | | 4.87 | | | | | |
| | | Synthetic example 3 | | | 4.00 | | | | |
| | | Synthetic example 4 | | | | 8.86 | | | |
| | | Synthetic example 5 | | | | | 8.18 | | |
| | | Synthetic example 8 | | | | | | 4.94 | |
| | | HF-1M[5] | | | | | | | 2.13 |
| | TPP[6] | | 0.02 | 0.02 | | | | | 0.02 |
| | 2E4MZ[7] | | | | 0.02 | 0.02 | 0.02 | 0.02 | |
| | Polyvinyl acetal | | 0.86 | 0.86 | 0.86 | 0.86 | 0.86 | 0.86 | 0.86 |
| | Silica | | 46.92 | 52.02 | 47.09 | 74.63 | 70.78 | 52.42 | 36.49 |
| | Filler amount (wt %) | | 85 | 85 | 85 | 85 | 85 | 85 | 85 |

TABLE 2-continued

| | Epoxy Compound (Synthetic Example No.) | | Example 7 | Example 8 | Example 9 | Example 10 | Example 11 | Example 12 | Comparative Example 2 |
|---|---|---|---|---|---|---|---|---|---|
| | | Filler composite | | | | | | | |
| Thermal resistance properties | CTE (ppm/ °C.) | $\alpha_1$ (T < Tg) | 5.45 | 5.41 | 7.97 | 7.05 | 7.19 | 7.06 | 8.57 |
| | Tg (° C.) | | Tg-Less | Tg-Less | Tg-Less | Tg-Less | Tg-Less | Tg-Less | 150 |

Note:
Compounds used in Tables 1 and 2 are as follows.
[1]DGEBA: Diglycidyl ether of bisphenol A (EEW = 190, Aldrich Co.)
[2]EXA4700: Binaphthalene-based epoxy (EEW = 162, DIC Co.)

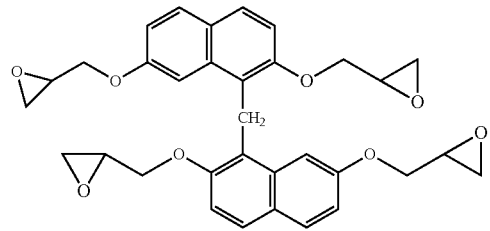 [SMILES: c1cc2ccc(OCC3CO3)c(Cc3c(OCC4CO4)ccc4ccc(OCC5CO5)cc34)c2cc1OCC1CO1]

[3]YX4000H: Biphenyl-based epoxy (Mitsubishi Chemical Co.)

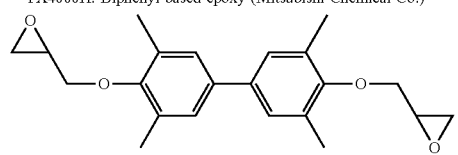

[4]Polydis: Rubber modified epoxy (Strruktol Co.)
[5]HF-1M: phenol novolac-based curing agent (Meiwa Plastic Industries, HEW = 107)

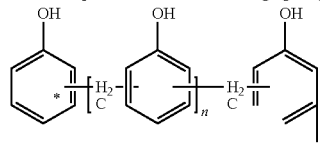

[6]TPP: triphenylphosphine (Aldrich Co.)
[7]2E4MZ: 2-ethyl-4-methyl imidazole (Aldrich Co.)

As shown in Table 1, composites of Examples 1 to 12 including an epoxy resin and a novolac curing agent with an alkoxysilyl group according to an exemplary embodiment in the present disclosure, exhibit a low CTE in comparison with composites of Comparative Examples 1 and 2 including an epoxy resin and a novolac curing agent in the related art which does not have an alkoxysilyl group, and do not exhibit a glass transition temperature (Tg-less, TgL), thereby improving thermal resistance.

The invention claimed is:

1. A novolac curing agent with at least one alkoxysilyl group selected from the group consisting of Formulae I-1, I-3 and I-4,

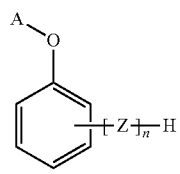

[Formula I-1]

in Formula I-1, Z is one selected from the group consisting of Formulae 1B to 1F:

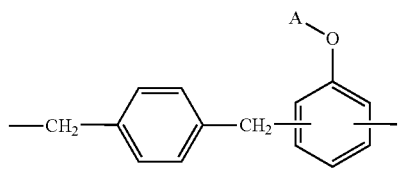

1B

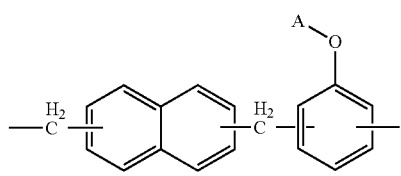

1C

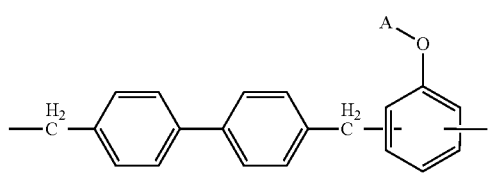

1D

-continued

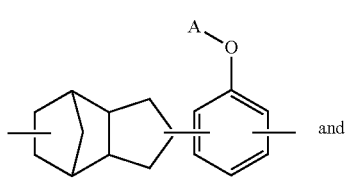
and

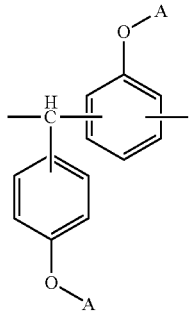

[Formula I-3]

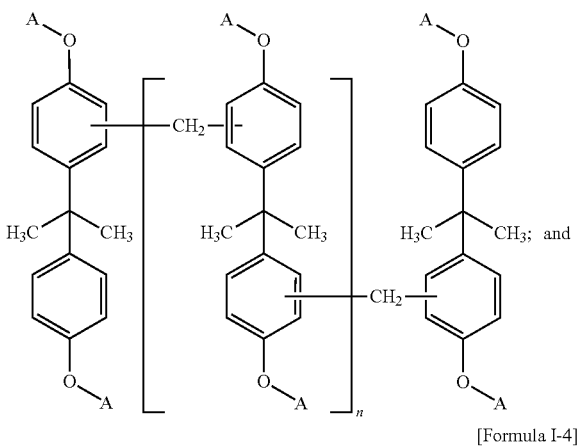

[Formula I-4]

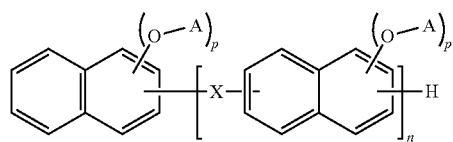

in Formula I-4, p is 1 or 2, and X is

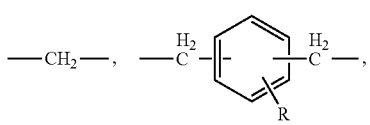

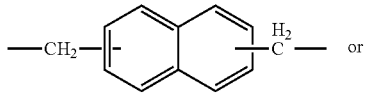

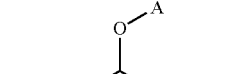

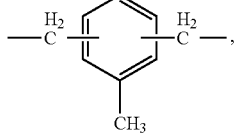

and in

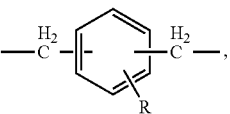

1E

[1F]

R is a linear or branched alkyl group of C1-C10,
in Formulae I-1, I-3 and I-4, at least one of A's has Formula A2 or A3, wherein in the case that at least one of A's is A2, the remainder of A's is Formula B2 or hydrogen, and in the case that at least one of A's is A3, the remainder of A's is hydrogen, and n is an integer of 1 or more, —(CH$_2$)$_m$—SiR$_1$R$_2$R$_3$  [Formula A2]

—CONH(CH$_2$)$_m$—SiR$_1$R$_2$R$_3$  [Formula A3]

in Formulae A2 and A3, at least one of R$_1$ to R$_3$ is a linear or branched alkoxy group of 1 to 5 carbon atoms, the remainder thereof is a linear or branched alkyl group of 1 to 10 carbon atoms, and m is an integer from 3 to 10, —(CH$_2$)$_l$—CH=CH$_2$  [Formula B2]

in Formula B2, l is an integer from 1 to 8,
wherein the novolac curing agent with at least one alkoxysilyl group selected from the group consisting of Formulae I-1, I-3 and I-4 is used as a curing agent in a composition comprising an epoxy resin and the curing agent.

2. A preparing method of a novolac curing agent with at least one alkoxysilyl group selected from the group consisting of Formulae I-1, I-3 and I-4, the preparing method comprising:
   a first step of preparing one of intermediates of Formulae IB-1, IB-3 and IB-4 by reacting one of starting materials of Formulae IA-1, IA-3 and IA-4 and an alkenyl compound of Formula II in the presence of a base and an optional solvent; and
   a second step of preparing one of compounds of Formulae I-1, I-3 and I-4 having a structure of Formula A2 by reacting one of intermediates of Formulae IB-1, IB-3 and IB-4 and alkoxysilane of Formula IIIA in the presence of a platinum catalyst and an optional solvent,

[Formula IA-1]

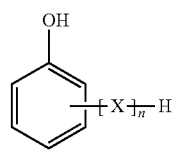

in Formula IA-1, X is one selected from the group consisting of Formulae 2B to 2F:

2B

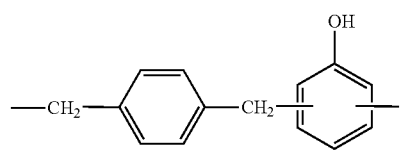

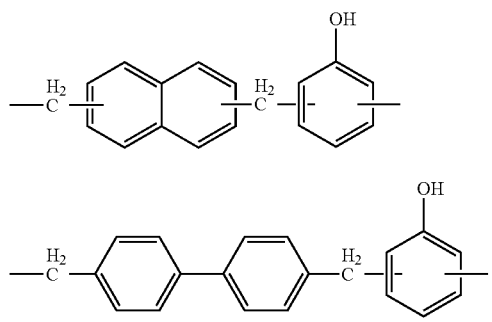
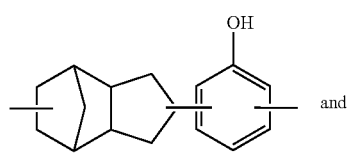
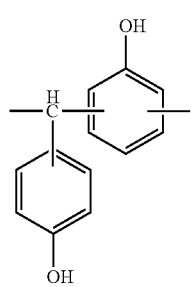
[Formula IA-3]
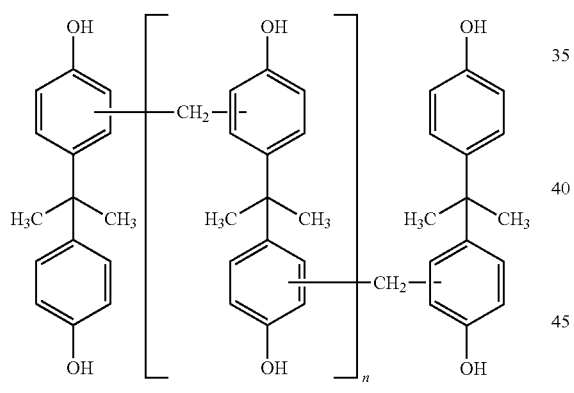
[Formula IA-4]
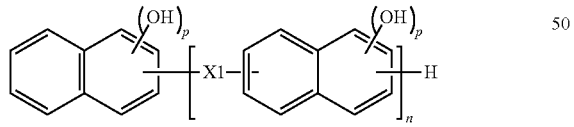
in Formula IA-4, p is 1 or 2, X1 is
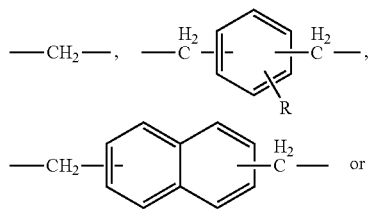
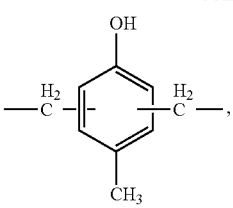
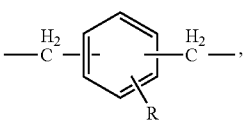
and in
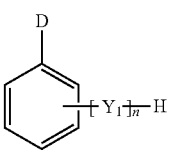
R is a linear or branched alkyl group of C1-C10,
in Formulae IA-1, IA-3 and IA-4, n is an integer of 1 or more,
[Formula IB-1]
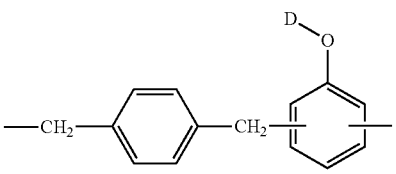
in Formula IB-1, $Y_1$ is one selected from the group consisting of Formulae 3B to 3F:
3B
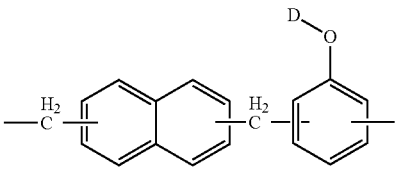
3C
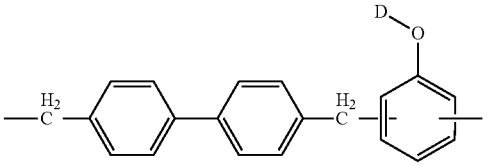
3D
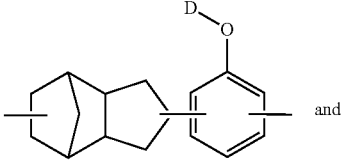
3E -continued

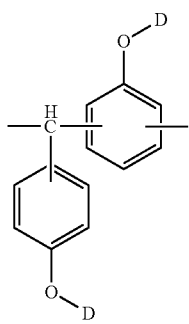

[Formula IB-3]

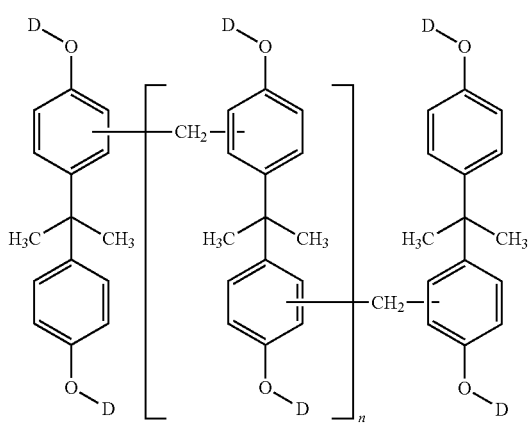

[Formula IB-4]

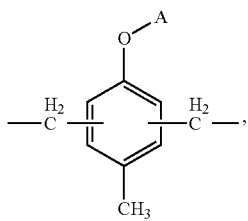

in Formula IB-4, p is 1 or 2, and X2 is

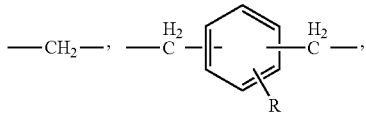,

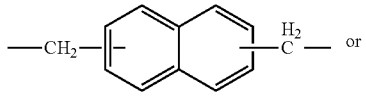 or

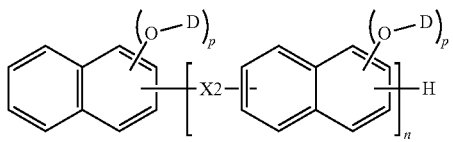, and in

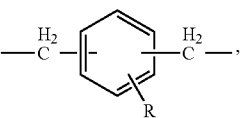,

R is a linear or branched alkyl group of C1-C10,
in Formulae IB-1, IB-3 and IB-4, at least one of D's is Formula B2, the remainder thereof is hydrogen, and n is an integer of 1 or more, —(CH$_2$)$_l$—CH=CH$_2$  [Formula B2]

in Formula B2, l is an integer from 1 to 8,

X—(CH$_2$)$_l$—CH=CH$_2$  [Formula II]

in Formula II, l is an integer from 1 to 8, and X is Cl, Br, I, —O—SO$_2$—CH$_3$, —O—SO$_2$—CF$_3$, or —O—SO$_2$—C$_6$H$_4$—CH$_3$, HSiR$_a$R$_b$R$_c$  [Formula IIIA]

in Formula IIIA, at least one of R$_a$ to R$_c$ is a linear or branched alkoxy group of C1-C5, and the remainder thereof is a linear or branched alkyl group of C1-C10,

[Formula I-1]

in Formula I-1, Z is one selected from the group consisting of Formulae 1B to 1F:

1B
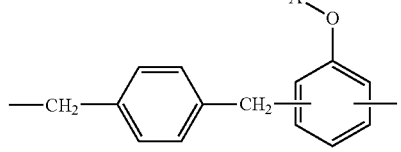

1C
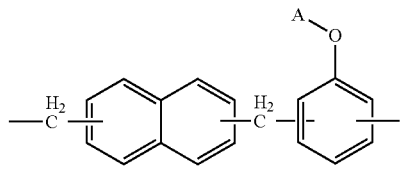

1D
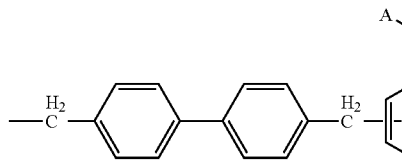

1E
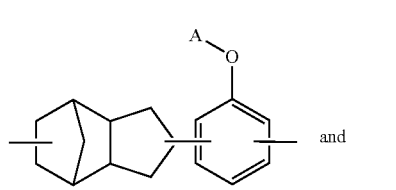

and

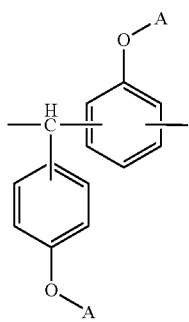

[Formula I-3]

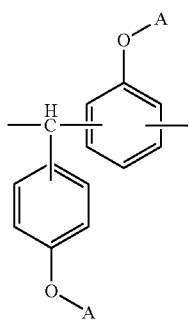

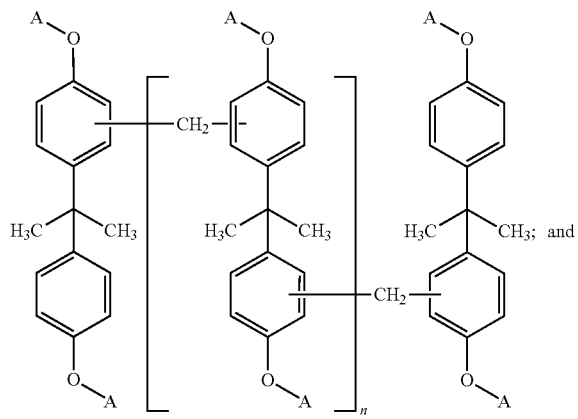

[Formula I-4]

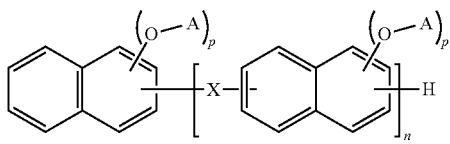

in Formula I-4, p is 1 or 2, and X is

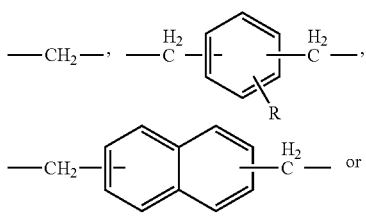

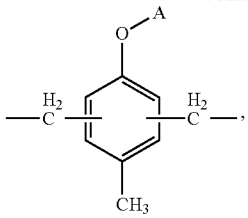

and in

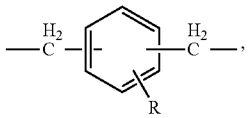

R is a linear or branched alkyl group of C1-C10,
in Formulae I-1, I-3 and I-4, at least one of A's is Formula A2, the remainder of A's is Formula B2 or hydrogen, and n is an integer of 1 or more, —(CH$_2$)$_m$—SiR$_1$R$_2$R$_3$ [Formula A2]

in Formula A2, at least one of R$_1$ to R$_3$ is a linear or branched alkoxy group of 1 to 5 carbon atoms, the remainder thereof is a linear or branched alkyl group of 1 to 10 carbon atoms, and m is an integer from 3 to 10, —(CH$_2$)$_l$—CH=CH$_2$ [Formula B2]

in Formula B2, l is an integer from 1 to 8,
wherein the novolac curing agent with at least one alkoxysilyl group selected from the group consisting of Formulae I-1, I-3 and I-4 is used as a curing agent in a composition comprising an epoxy resin and the curing agent.

3. A preparing method of a novolac curing agent with at least one alkoxysilyl group selected from the group consisting of Formulae I-1, I-3 and I-4, the preparing method comprising:
an alkoxysilylation step of preparing one of compounds of Formulae I-1, I-3 and I-4 with a structure of Formula A3 by reacting one of starting materials of Formulae IA-1, IA-3 and IA-4 and alkoxysilane of Formula IIIB in the presence of an optional base and an optional solvent,

[Formula IA-1]

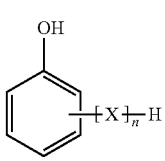

in Formula IA-1, X is one selected from the group consisting of Formulae 2B to 2F:

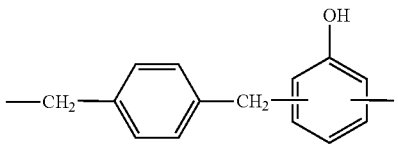

-continued

[2C structure: -CH2-naphthalene-CH2-phenol(OH)-]

[2D structure: -CH2-biphenyl-CH2-phenol(OH)-]

[2E structure: dicyclopentadiene-phenol(OH), labeled a: or]

[2F structure: -CH(4-hydroxyphenyl)-phenol(OH)-]

[Formula IA-3]

[Structure showing bisphenol A repeating units with OH groups and CH2 linkers, subscript n]

[Formula IA-4]

[Structure: naphthalene(OH)p—X1—naphthalene(OH)p, subscript n, H]

in Formula IA-4, p is 1 or 2, and X1 is

—CH2—, —CH2-phenyl(R)-CH2—,

—CH2-naphthalene-CH2— or

-continued

[2C' structure: -CH2-phenyl(O-A)(CH3)-CH2-]

and in

[2E' structure: -CH2-phenyl(R)-CH2-]

R is a linear or branched alkyl group of C1-C10, in Formulae IA-1, IA-3 and IA-4, n is an integer of 1 or more, $$OCN—(CH_2)_m—SiR_1R_2R_3 \quad \text{[Formula IIIB]}$$

in Formula IIIB, at least one of $R_1$ to $R_3$ is a linear or branched alkoxy group of 1 to 5 carbon atoms, the remainder thereof is a linear or branched alkyl group of 1 to 10 carbon atoms, and m is an integer from 3 to 10,

[Formula I-1]

[Structure: A-O-phenyl-(Z)n-H]

in Formula I-1, Z is one selected from the group consisting of Formulae 1B to 1F:

1B

[Structure: -CH2-phenyl-CH2-phenyl(O-A)-]

1C

[Structure: -CH2-naphthalene-CH2-phenyl(O-A)-]

1D

[Structure: -CH2-biphenyl-CH2-phenyl(O-A)-]

-continued

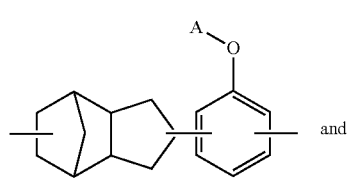 and

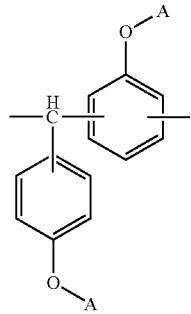

[Formula I-3]

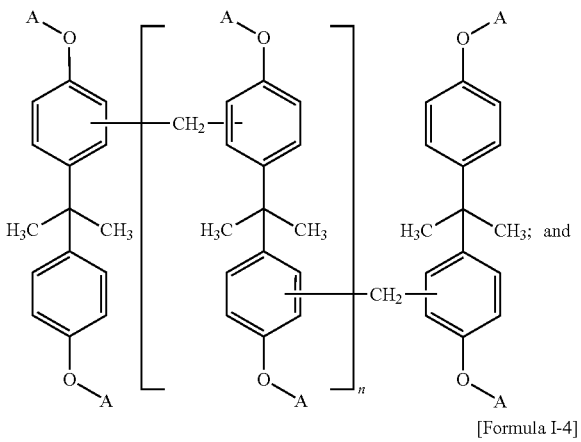; and

[Formula I-4]

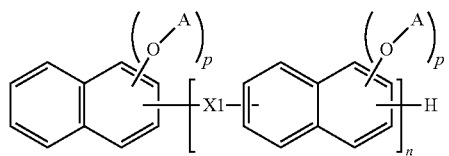

in Formula I-4, p is 1 or 2, and X is

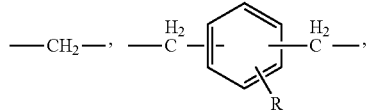

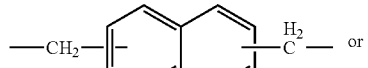 or

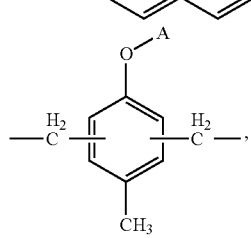

and in

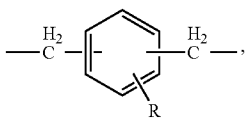,

R is a linear or branched alkyl group of C1-C10, in Formulae I-1, I-3 and I-4, at least one of A's is Formula A3, the remainder of A's is hydrogen, and n is an integer of 1 or more, —CONH(CH$_2$)$_m$—SiR$_1$R$_2$R$_3$ [Formula A3]

in Formula A3, at least one of R$_1$ to R$_3$ is a linear or branched alkoxy group of 1 to 5 carbon atoms, the remainder thereof is a linear or branched alkyl group of 1 to 10 carbon atoms, and m is an integer from 3 to 10, wherein the novolac curing agent with at least one alkoxysilyl group selected from the group consisting of Formulae I-1, I-3 and I-4 is used as a curing agent in a composition comprising an epoxy resin and the curing agent.

4. A composition comprising an epoxy resin and a novolac curing agent with at least one alkoxysilyl group selected from the group consisting of Formulae I-1, I-3 and I-4,

[Formula I-1]

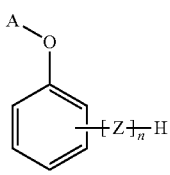

in Formula I-1, Z is one selected from the group consisting of Formulae 1B to 1F:

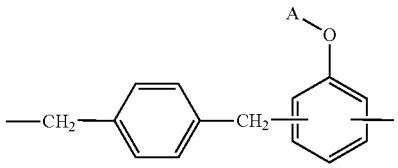

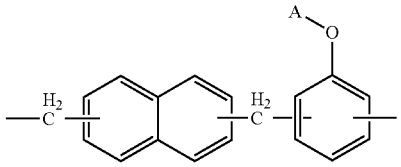

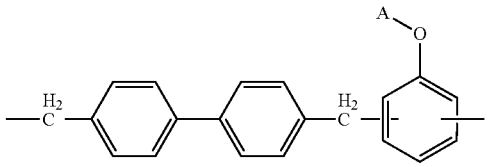

-continued

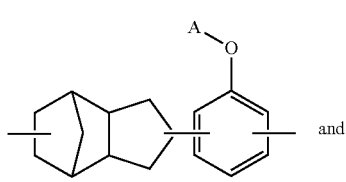

and

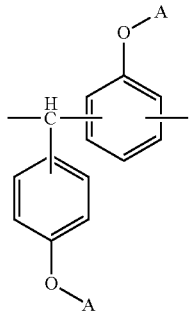

[Formula I-3]

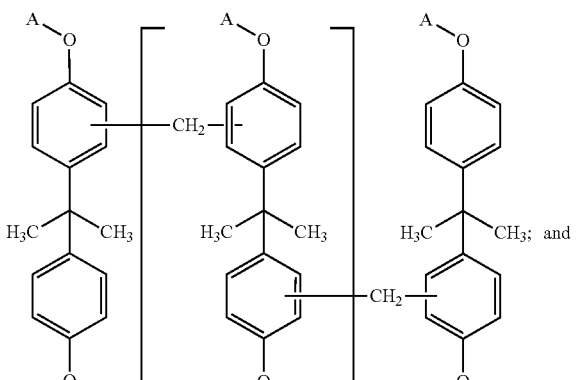

[Formula I-4]

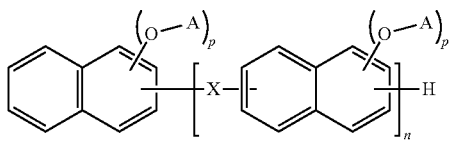

in Formula I-4, p is 1 or 2, X is

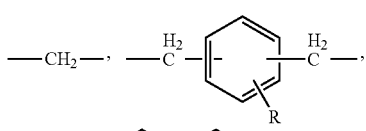

or

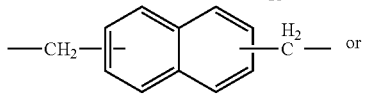

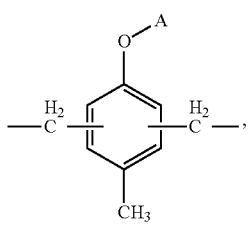

and in

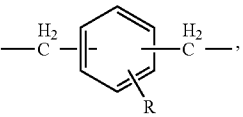

R is a linear or branched alkyl group of C1-C10,
in Formulae I-1, I-3 and I-4, at least one of A's has Formula A2 or A3, where in the case that at least one of A's is A2, the remainder of A's is Formula B2 or hydrogen, and in the case that at least one of A's is A3, the remainder thereof is hydrogen, and n is an integer of 1 or more, $-(CH_2)_m-SiR_1R_2R_3$      [Formula A2]

$-CONH(CH_2)_m-SiR_1R_2R_3$      [Formula A3]

in Formulae A2 and A3, at least one of $R_1$ to $R_3$ is a linear or branched alkoxy group of 1 to 5 carbon atoms, the remainder thereof is a linear or branched alkyl group of 1 to 10 carbon atoms, and m is an integer from 3 to 10, $-(CH_2)_l-CH=CH_2$      [Formula B2]

in Formula B2, l is an integer from 1 to 8,
wherein the epoxy resin is cured by the novolac curing agent.

5. The composition of claim 4, wherein the epoxy resin does or does not include an alkoxysilyl group.

6. The composition of claim 4, further comprising at least one selected from the group consisting of inorganic particles and a fiber, as a filler.

7. The composition of claim 6, wherein the inorganic particles are at least one selected from the group consisting of silica, zirconia, titania, alumina, silicon nitride, aluminum nitride, and silsesquioxane.

8. The composition of claim 6, wherein the fiber is at least one selected from the group consisting of a glass fiber selected from the group consisting of an E-glass fiber, a T-glass fiber, an S-glass fiber, an NE-glass fiber, an H-glass fiber, and quartz; and an organic fiber selected from the group consisting of a liquid crystal polyester fiber, a polyethyleneterephthalate fiber, a wholly aromatic fiber, a polybenzoxazole fiber, a nylon fiber, a polyethylene naphthalate fiber, a polypropylene fiber, a polyether sulfone fiber, a polyvinylidene fluoride fiber, a polyethylene sulfide fiber, and a polyether ether ketone fiber.

9. An electronic material comprising the composition according to claim 4.

10. A substrate comprising the composition according to claim 4.

11. A film comprising the composition according to claim 4.

12. A laminated plate comprising a metal layer disposed on a base layer formed by using the composition according to claim 4.

13. A printed circuit board comprising the laminated plate according to claim 12.

14. A semiconductor device comprising the printed circuit board according to claim 13.

15. A semiconductor packaging material comprising the composition according to claim 4.

16. A semiconductor device comprising the semiconductor packaging material according to claim 15.

17. An adhesive comprising the composition according to claim 4.

18. A paint comprising the composition according to claim 4.

19. A prepreg comprising the composition according to claim 4.

20. A laminated plate comprising a metal layer disposed on the prepreg of claim 19.

* * * * *